US011823997B2

(12) United States Patent
Thomas et al.

(10) Patent No.: US 11,823,997 B2
(45) Date of Patent: Nov. 21, 2023

(54) CHIP WITH BIFUNCTIONAL ROUTING AND ASSOCIATED METHOD OF MANUFACTURING

(71) Applicant: COMMISSARIAT À L'ÉNERGIE ATOMIQUE ET AUX ÉNERGIES ALTERNATIVES, Paris (FR)

(72) Inventors: Candice Thomas, Grenoble (FR); Jean Charbonnier, Grenoble (FR); Perceval Coudrain, Grenoble (FR); Maud Vinet, Grenoble (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 185 days.

(21) Appl. No.: 17/479,472

(22) Filed: Sep. 20, 2021

(65) Prior Publication Data
US 2022/0093501 A1    Mar. 24, 2022

(30) Foreign Application Priority Data
Sep. 21, 2020   (FR) .................................... 2009541

(51) Int. Cl.
H01L 23/498    (2006.01)
H01L 21/768    (2006.01)
(Continued)

(52) U.S. Cl.
CPC ....... H01L 23/49888 (2013.01); G06N 10/00 (2019.01); H01L 21/76891 (2013.01); H01L 24/13 (2013.01); H10N 60/815 (2023.02)

(58) Field of Classification Search
CPC .............................................. H01L 23/49888
See application file for complete search history.

(56) References Cited

U.S. PATENT DOCUMENTS 5,061,686 A * 10/1991 Ruby ..................... H01L 28/55
                                                    361/321.1
8,241,701 B2 * 8/2012 Dordi ................ H01L 21/67161
                                                    427/97.9
(Continued)

FOREIGN PATENT DOCUMENTS

WO    WO 2014/168665 A2    10/2014
WO    WO 2018/052399 A1     3/2018
WO    WO 2018/063204 A1     4/2018

OTHER PUBLICATIONS

Search Report as issued in French Patent Application No. 2009541, dated Jun. 24, 2021.
(Continued)

Primary Examiner — William A Harriston
(74) Attorney, Agent, or Firm — Pillsbury Winthrop Shaw Pittman LLP

(57) ABSTRACT

A functional chip includes a substrate including a first face and a second face, the second face of the substrate forming the front face of the functional chip; a first oxide layer on the first face of the substrate; a second oxide layer on the first oxide layer; a first routing level formed on the surface of the second oxide layer in contact with the first oxide layer; a third oxide layer on the second oxide layer wherein a semiconductor component is inserted; a rear face formed by the surface of the third oxide layer opposite the second oxide layer, the rear face including superconductor routing tracks surrounded at least partially by one or more conductor routing tracks, the semiconductor component being connected to the superconductor routing tracks via superconductor vias and the conductor routing tracks of the rear face being connected to the routing level via conductor vias.

12 Claims, 19 Drawing Sheets

(51) Int. Cl.
  *H01L 23/00* (2006.01)
  *G06N 10/00* (2022.01)
  *H10N 60/81* (2023.01)

(56) References Cited

U.S. PATENT DOCUMENTS

| | | | | |
|---|---|---|---|---|
| 9,455,391 | B1* | 9/2016 | Nayfeh | H10N 60/12 |
| 9,530,873 | B1 | 12/2016 | Carroll et al. | |
| 9,780,285 | B1* | 10/2017 | Kirby | H10N 60/805 |
| 10,998,486 | B1* | 5/2021 | Martinis | G06N 10/00 |
| 2007/0194225 | A1* | 8/2007 | Zorn | G01Q 30/10 |
| | | | | 250/306 |
| 2008/0311711 | A1* | 12/2008 | Hampp | H01L 21/76814 |
| | | | | 257/E21.409 |
| 2011/0175061 | A1* | 7/2011 | Berkley | H10N 69/00 |
| | | | | 505/190 |
| 2015/0119252 | A1* | 4/2015 | Ladizinsky | H10N 60/0156 |
| | | | | 505/410 |
| 2015/0357550 | A1* | 12/2015 | Schoelkopf, III | H10N 60/20 |
| | | | | 257/31 |
| 2018/0138389 | A1* | 5/2018 | Kirby | H10N 60/0156 |
| 2019/0273197 | A1 | 9/2019 | Roberts et al. | |
| 2020/0006619 | A1* | 1/2020 | Fuhrer | H10N 60/01 |
| 2020/0266234 | A1* | 8/2020 | Boothby | H01L 28/60 |
| 2021/0175095 | A1* | 6/2021 | Jeffrey | G06N 10/00 |
| 2022/0271151 | A1* | 8/2022 | Bedecarrats | H01L 29/78648 |
| 2023/0061391 | A1* | 3/2023 | Nemouchi | H10N 60/0912 |

OTHER PUBLICATIONS

Rosenberg, D., et al., "3D integrated qubits," ARXIV.org, Cornell University, Jun. 2017, XP080769525, 6 pages.

VII. Thermal Conductivity of Some Solids, Jan. 1967, 73 pages.

Foxen, B., et al., "Qubit compatible superconducting interconnects," Quantum Science and Technology, vol. 3, (2018), 12 pages.

Kushnir, V. et al., "Proximity effect and interference transparency in Nb/Cu multilayers," Journal of Applied Physics, vol. 106, (2009), 4 pages.

Tolpygo, S. K., "Superconductor Digital Electronics: Scalability and Energy Efficiency Issues." Low Temperature Physics, vol. 42, (2016), 20 pages.

Triantopoulos, K., et al., "Self-Heating Effect in FDSOI Transistors Down to Cryogenic Operation at 4.2 K," IEEE Transactions on Electron Devices, vol. 66, No. 8, Aug. 2019, pp. 3498-3505.

\* cited by examiner

[Fig. 1]
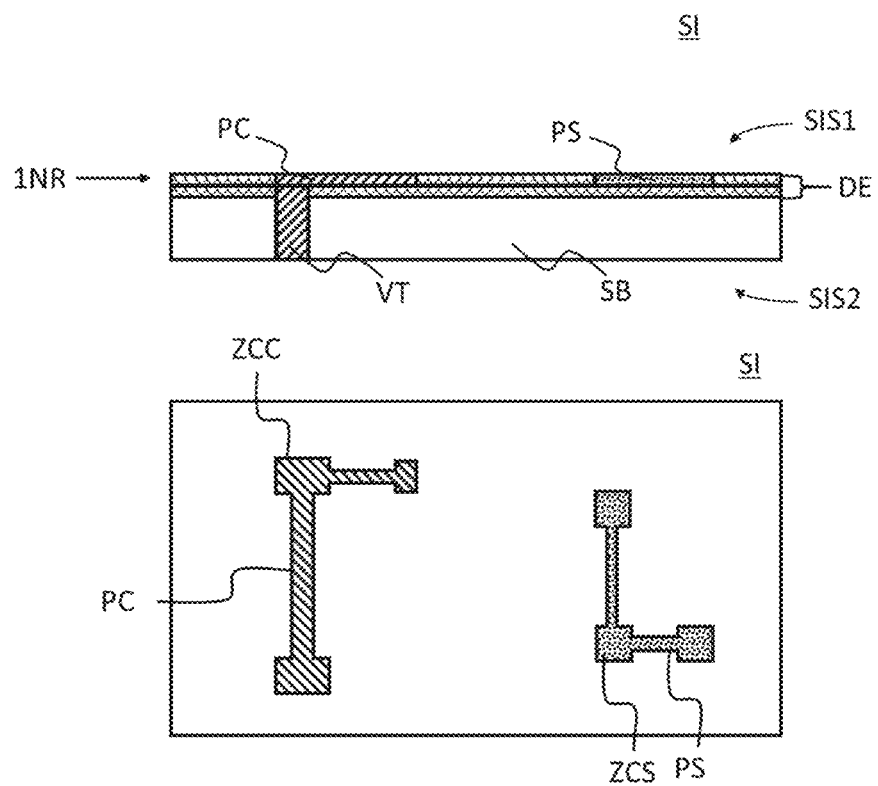

[Fig. 2]
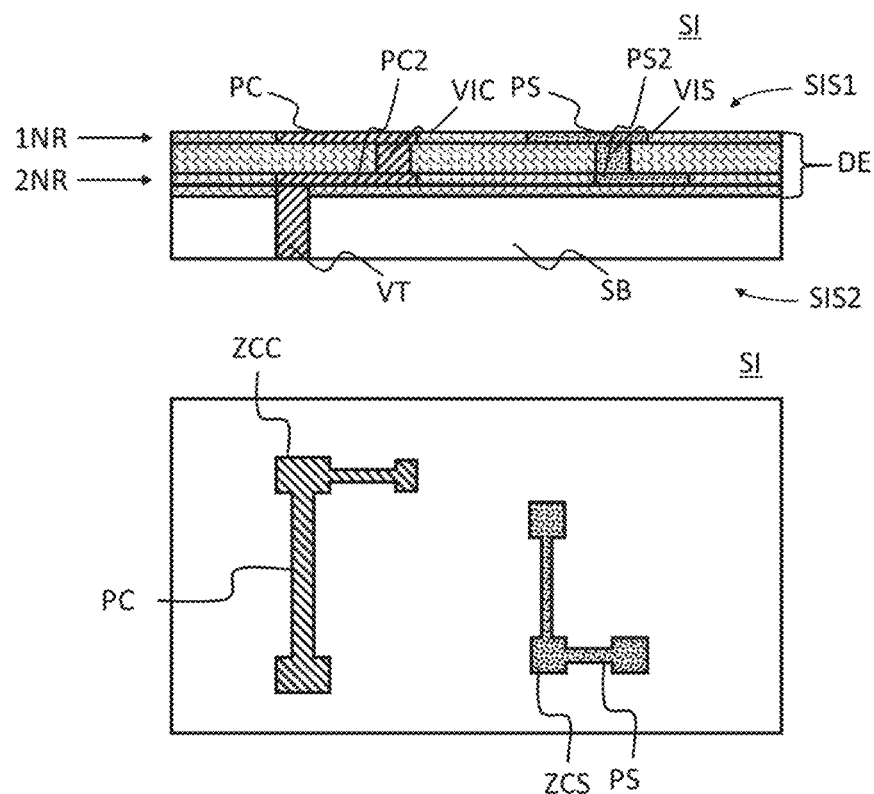
[Fig. 3A]
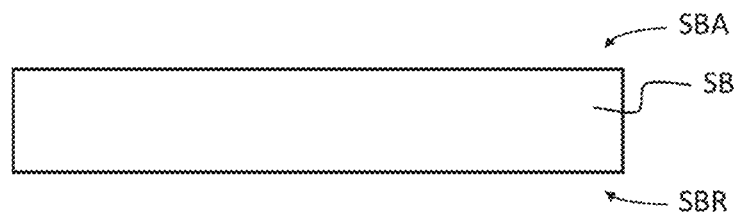

[Fig. 3B]
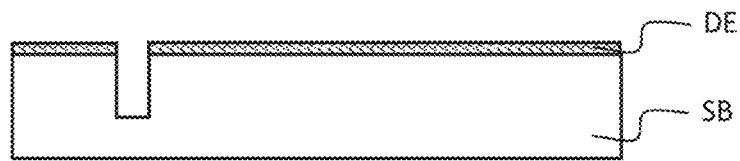
[Fig. 3C]
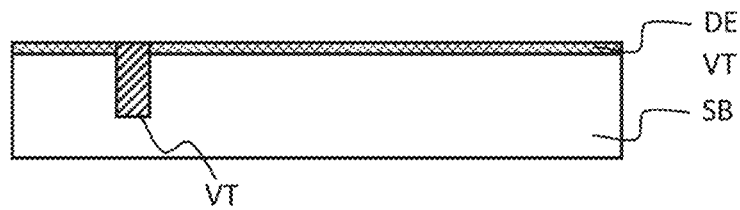
[Fig. 4A]
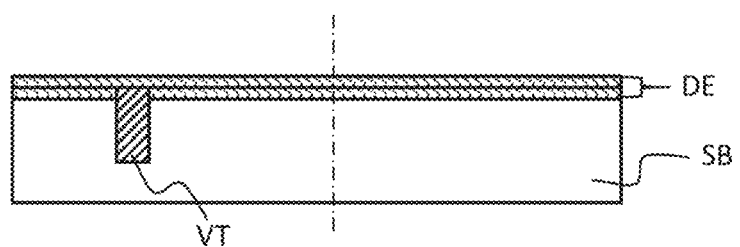
[Fig. 4B]
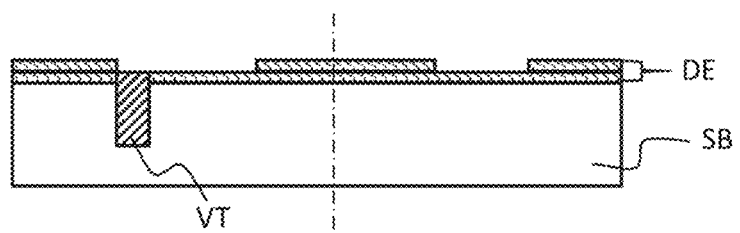

[Fig. 4C]
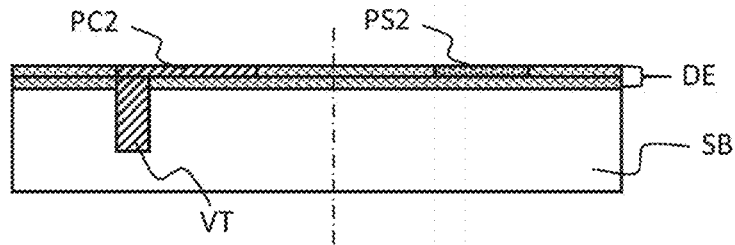
[Fig. 5A]
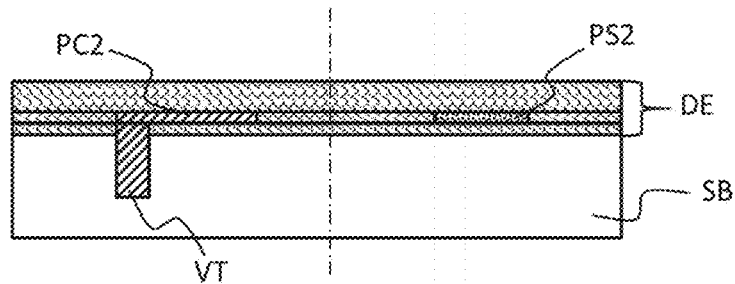
[Fig. 5B]
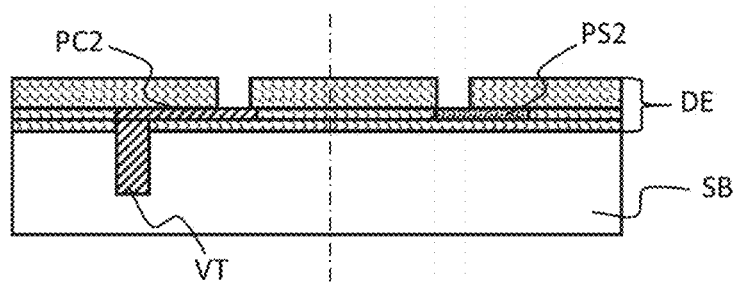
[Fig. 5C]
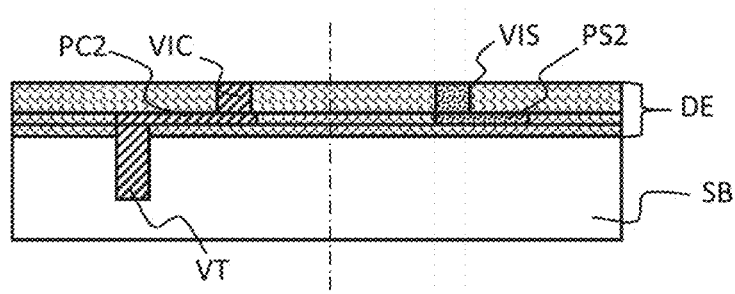

[Fig. 6A]
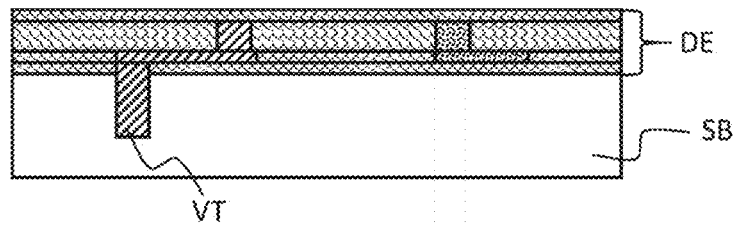
[Fig. 6B]
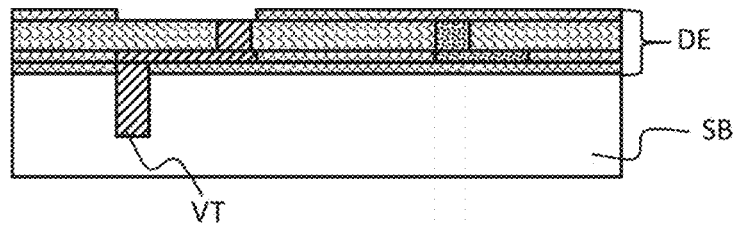
[Fig. 6C]
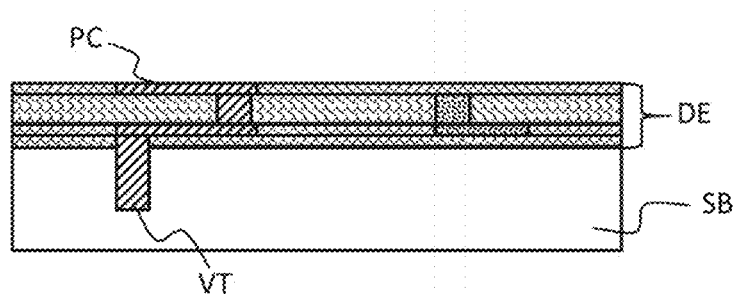
[Fig. 7A]
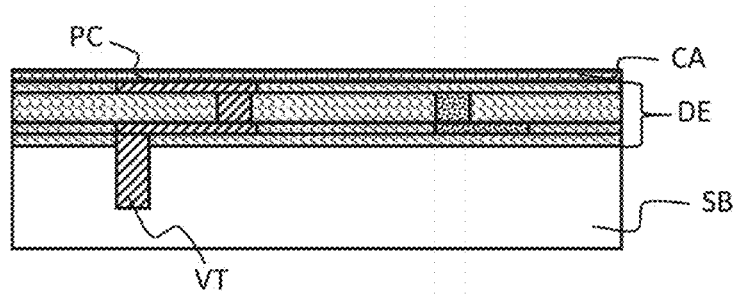

[Fig. 7B]
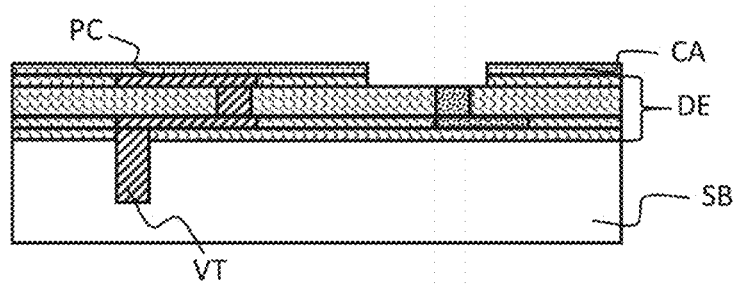
[Fig. 7C]
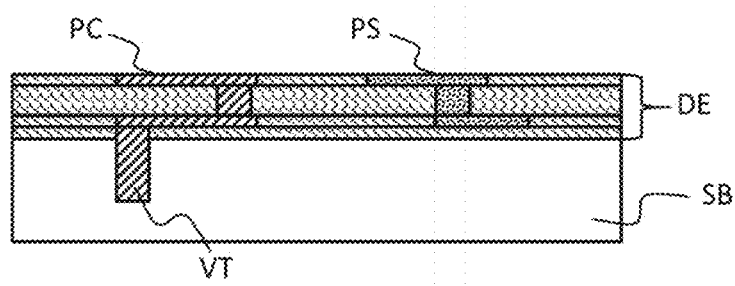
[Fig. 8A]
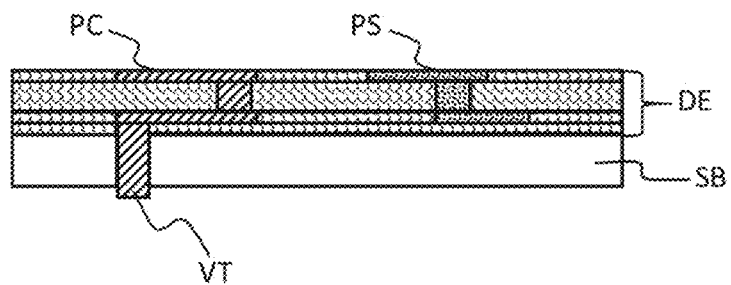
[Fig. 8B]
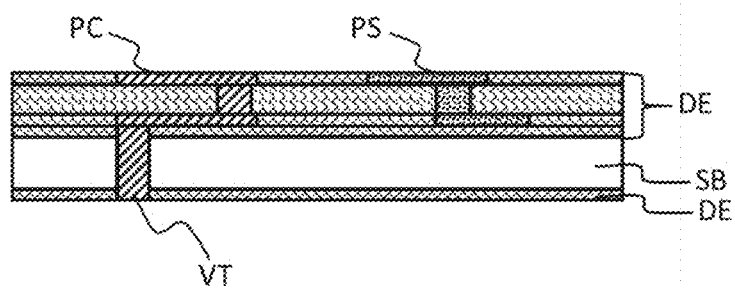

[Fig. 8C]
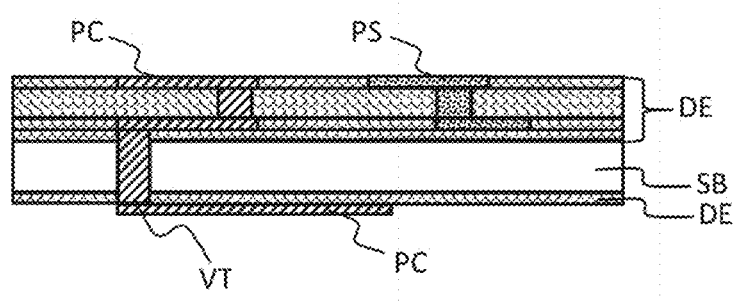
[Fig. 8D]
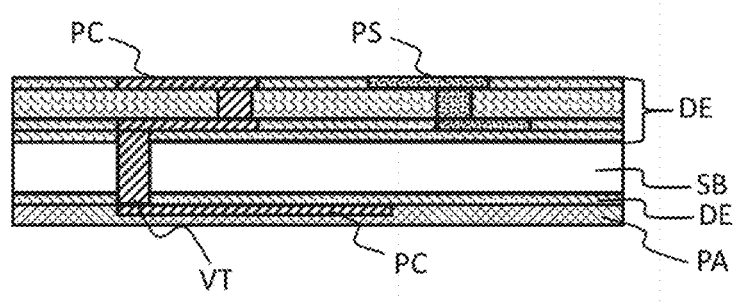
[Fig. 8E]
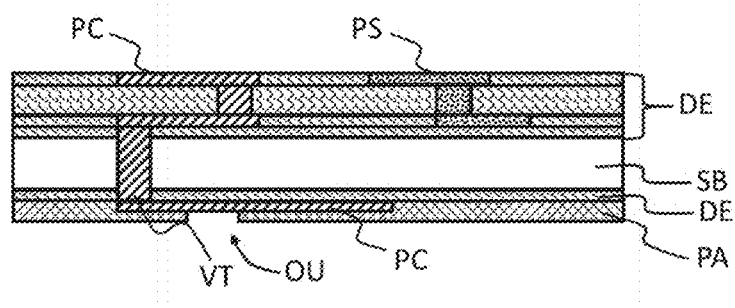
[Fig. 9]
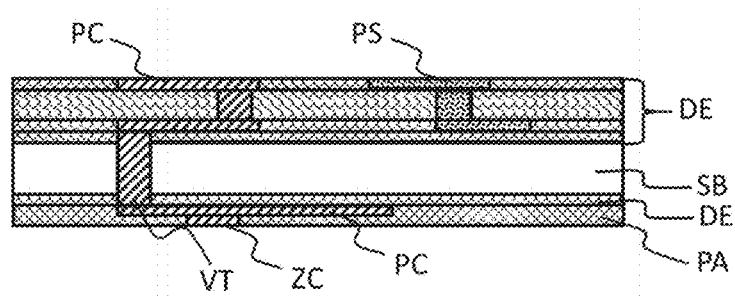

[Fig. 10A]
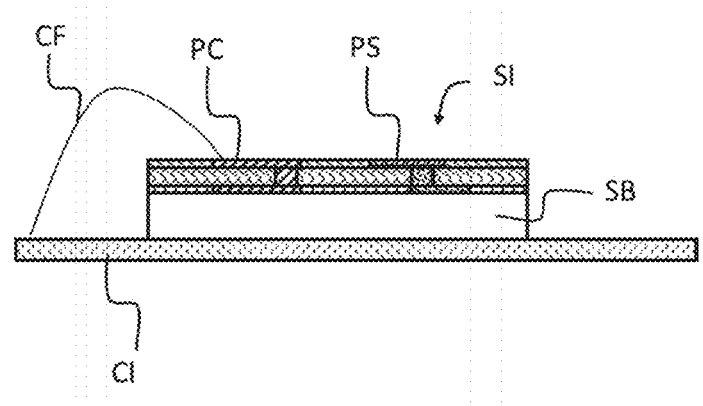
[Fig. 10B]
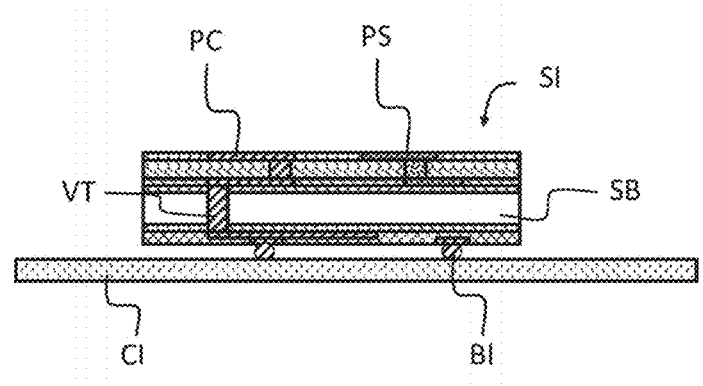
[Fig. 10C]
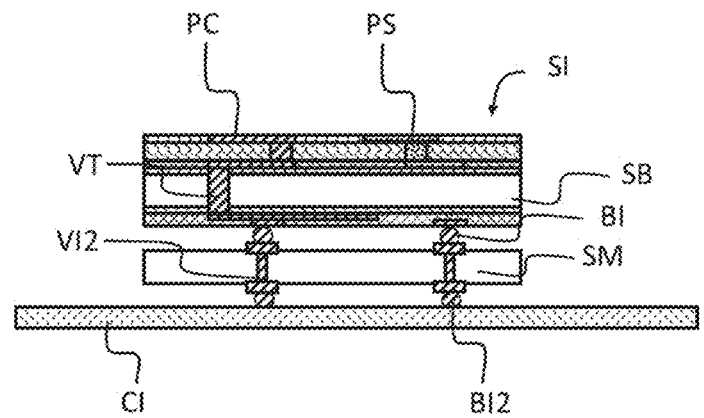

[Fig. 11]
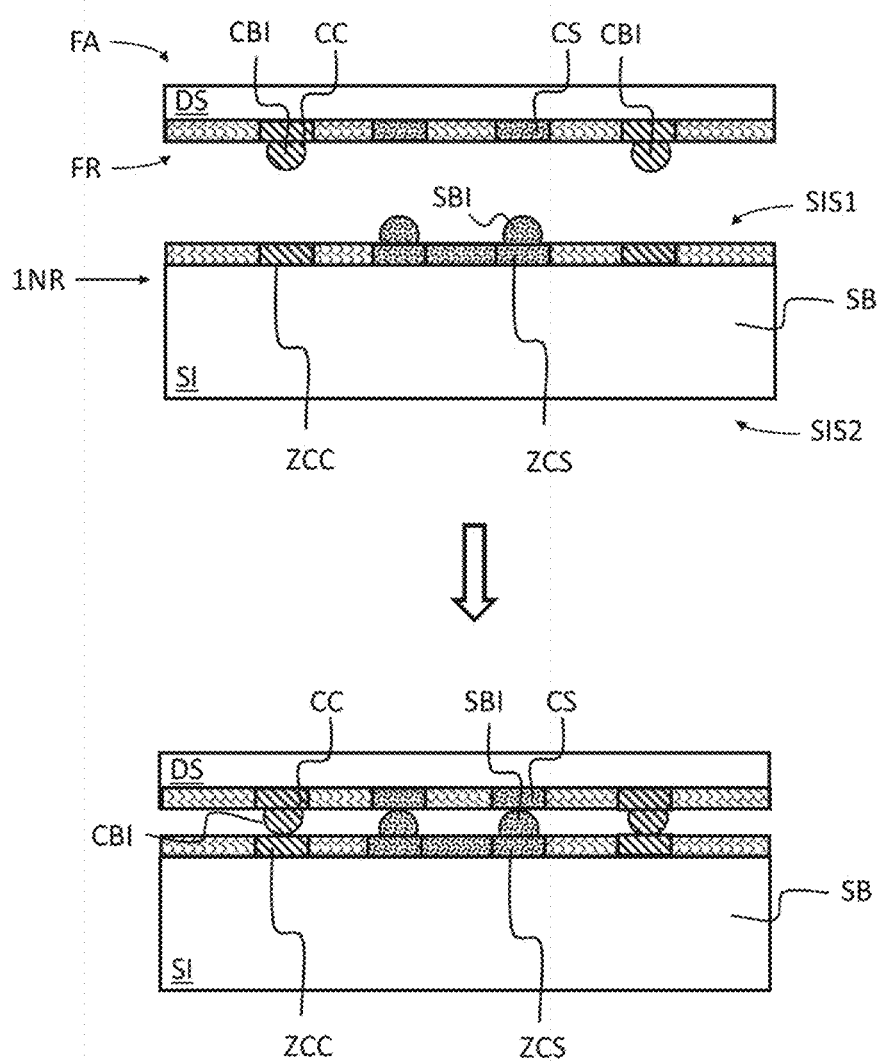

[Fig. 12A]
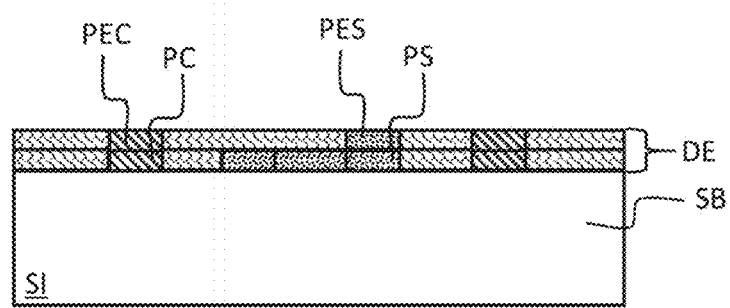
[Fig. 12B]
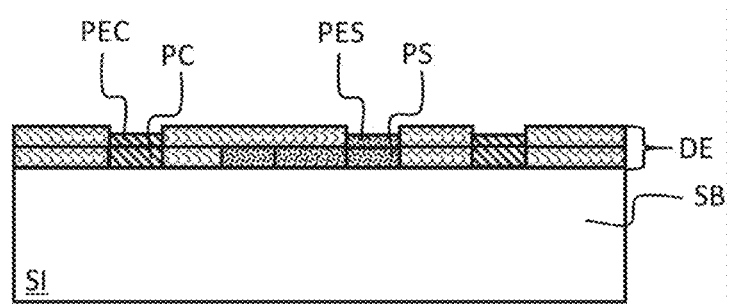
[Fig. 12C]
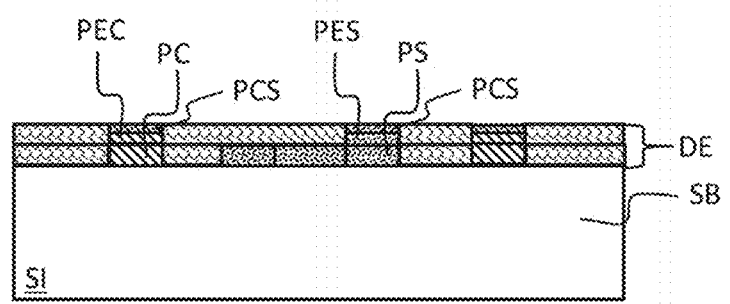

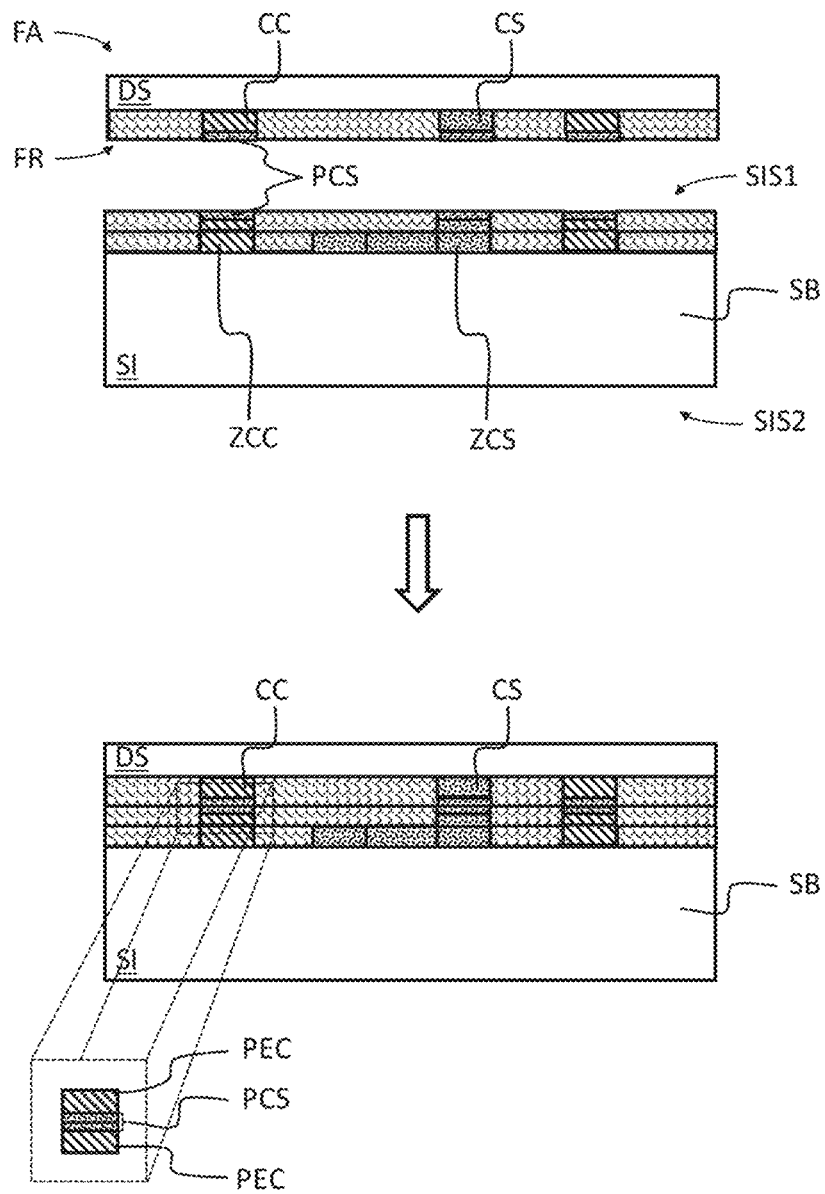
[Fig. 13]

[Fig. 14]
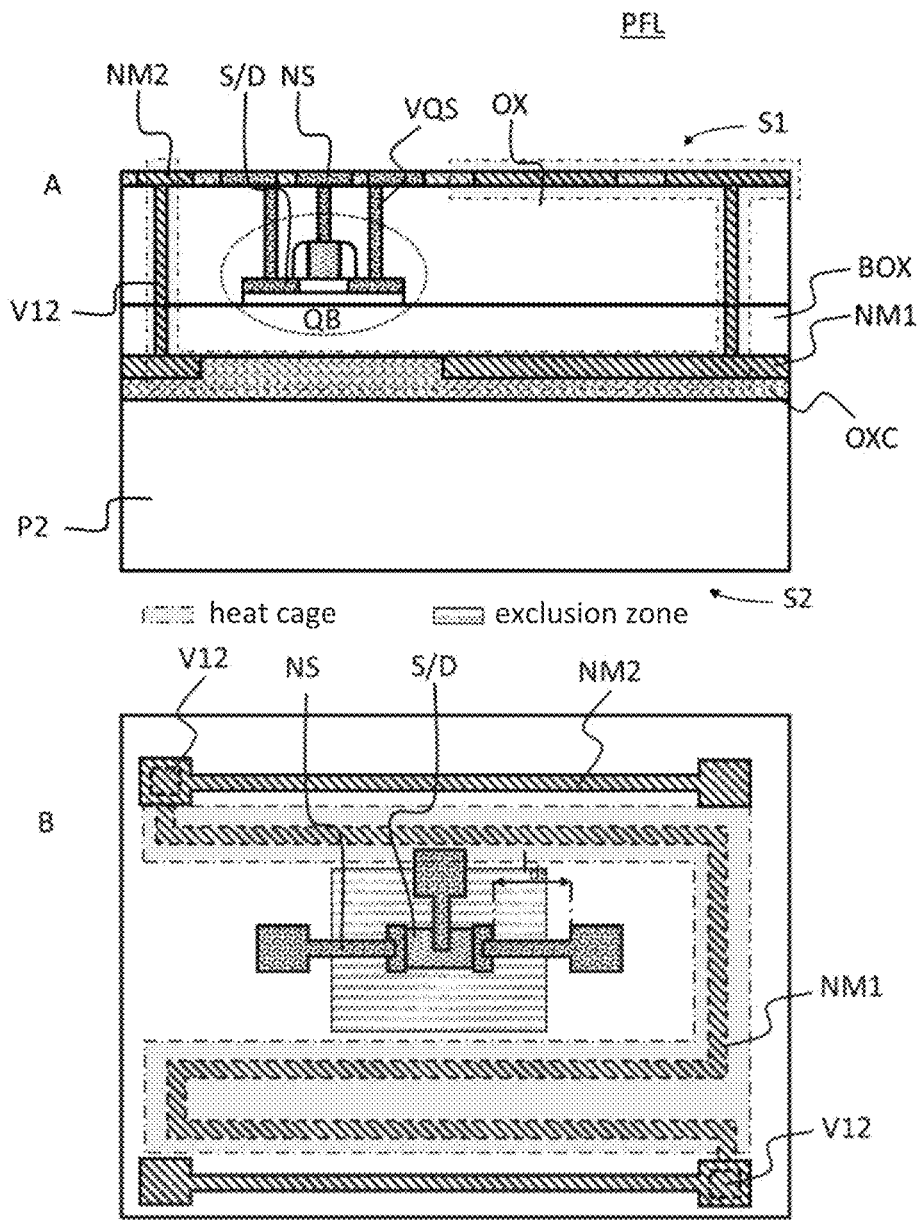

[Fig. 15A]
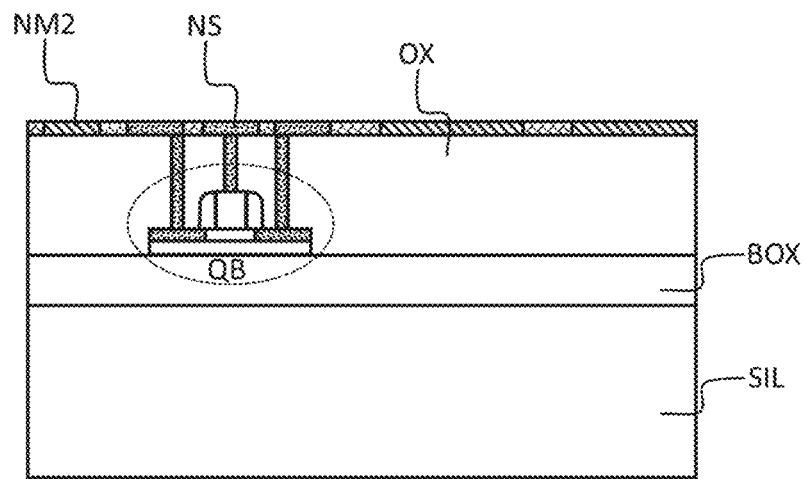
[Fig. 15B]
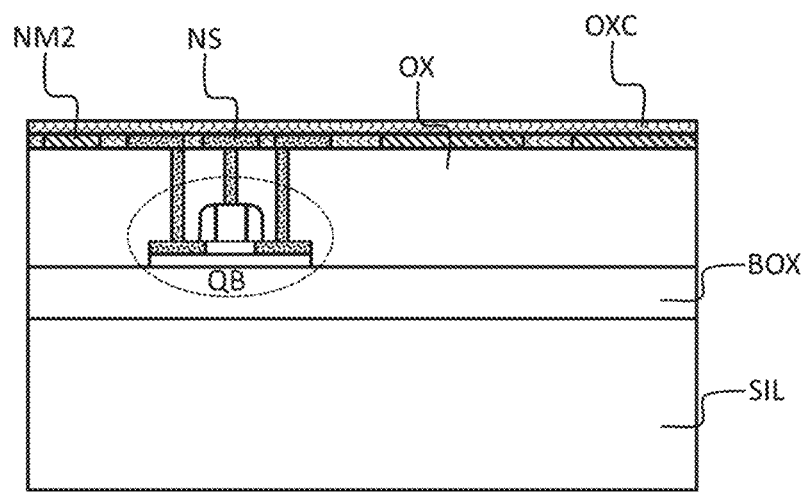

[Fig. 15C]
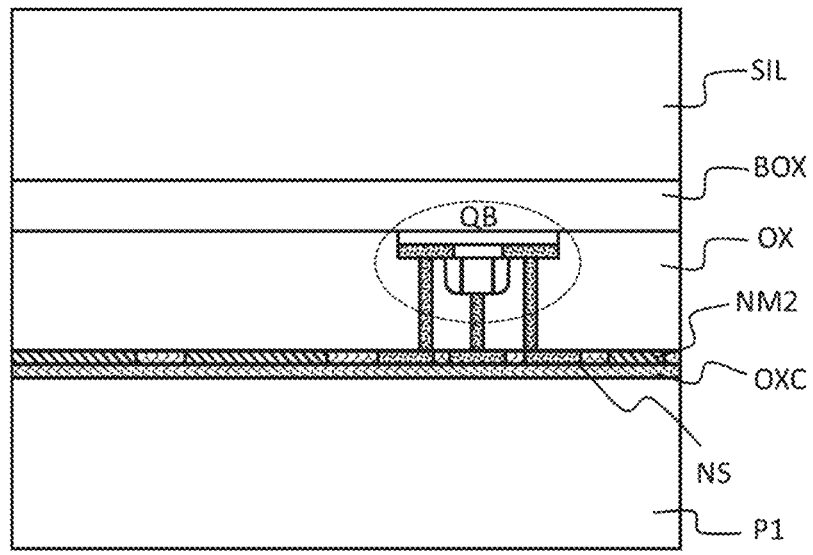
[Fig. 15D]
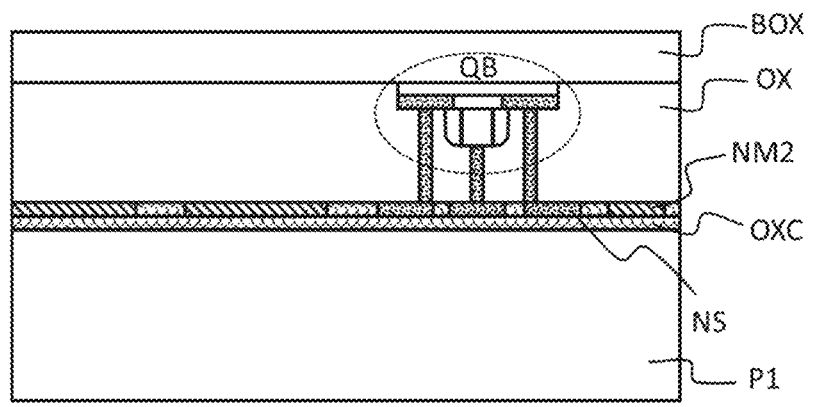

[Fig. 15E]
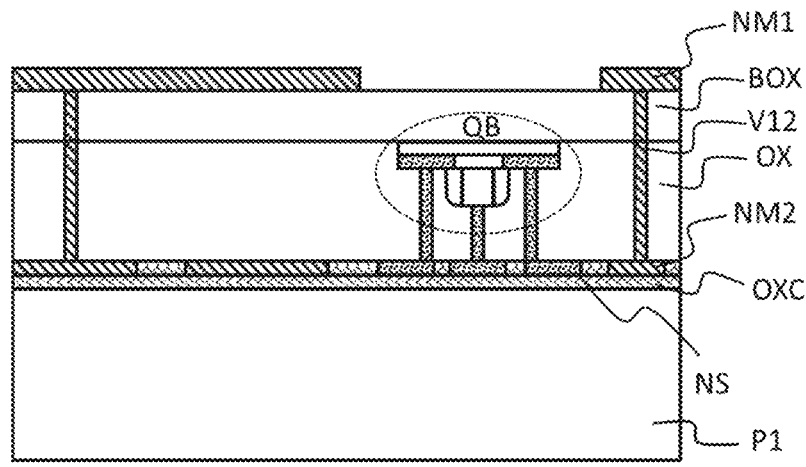
[Fig. 15F]
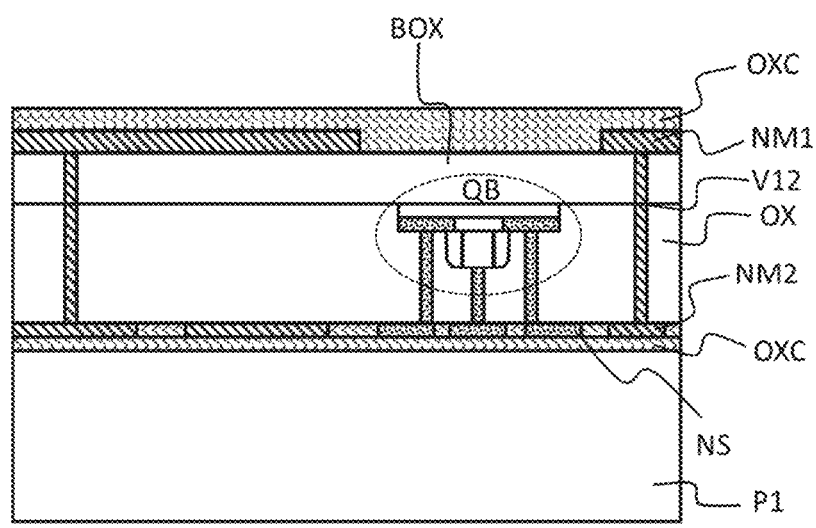

[Fig. 15G]
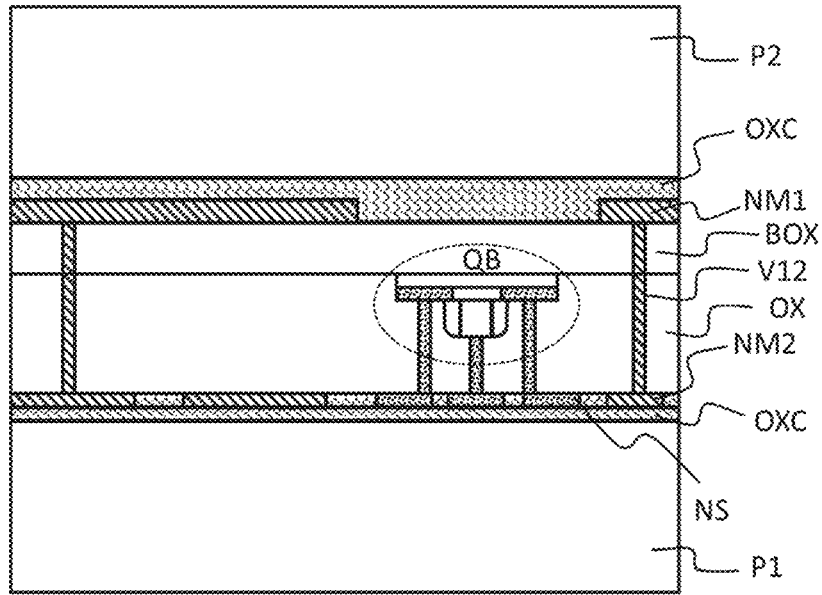
[Fig. 15H]
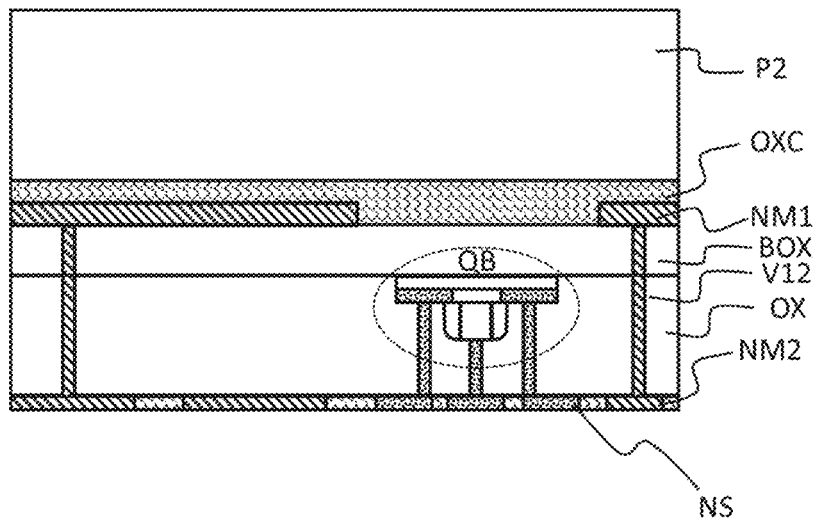

[Fig. 16]
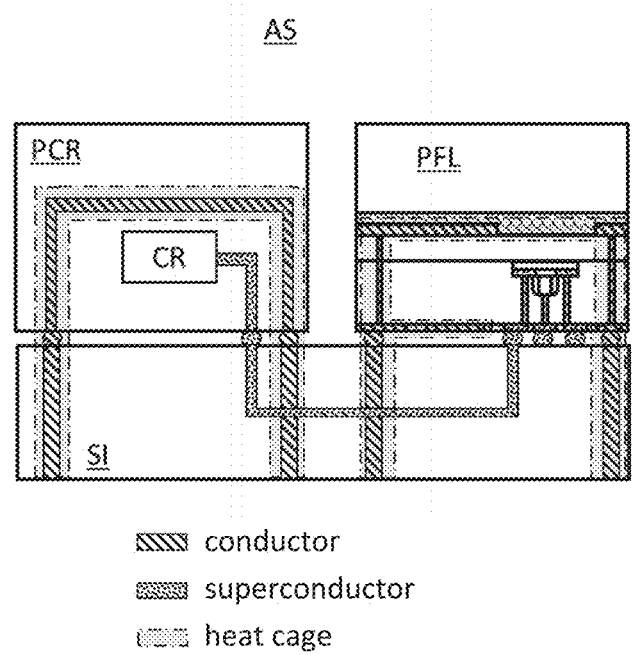
[Fig. 17]
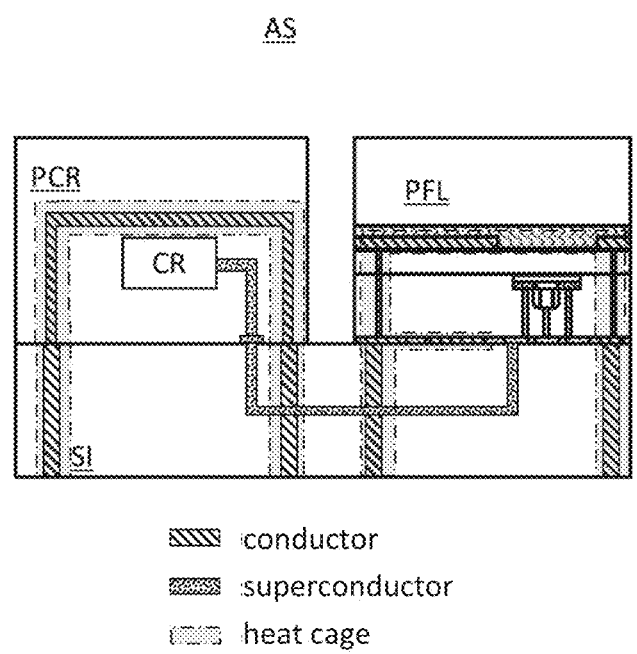

[Fig. 18]
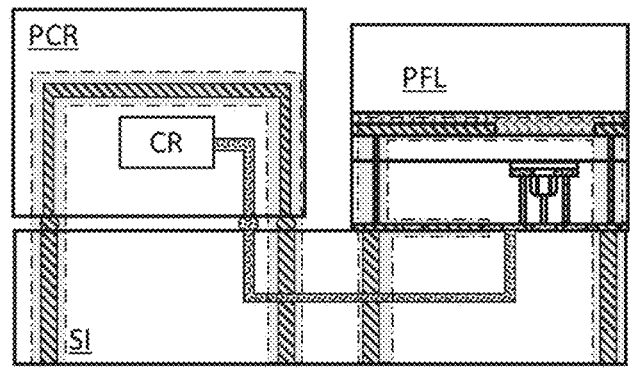
conductor
superconductor
heat cage
[Fig. 19]
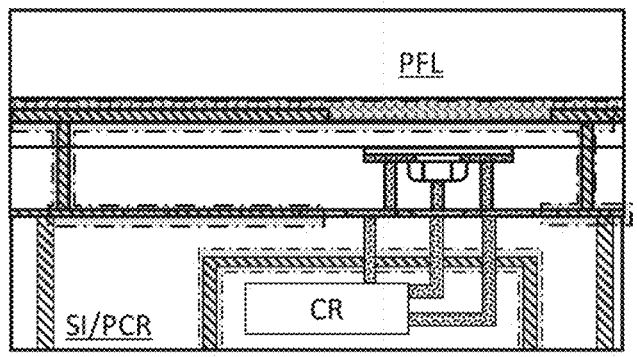
conductor
superconductor
heat cage

[Fig. 20]
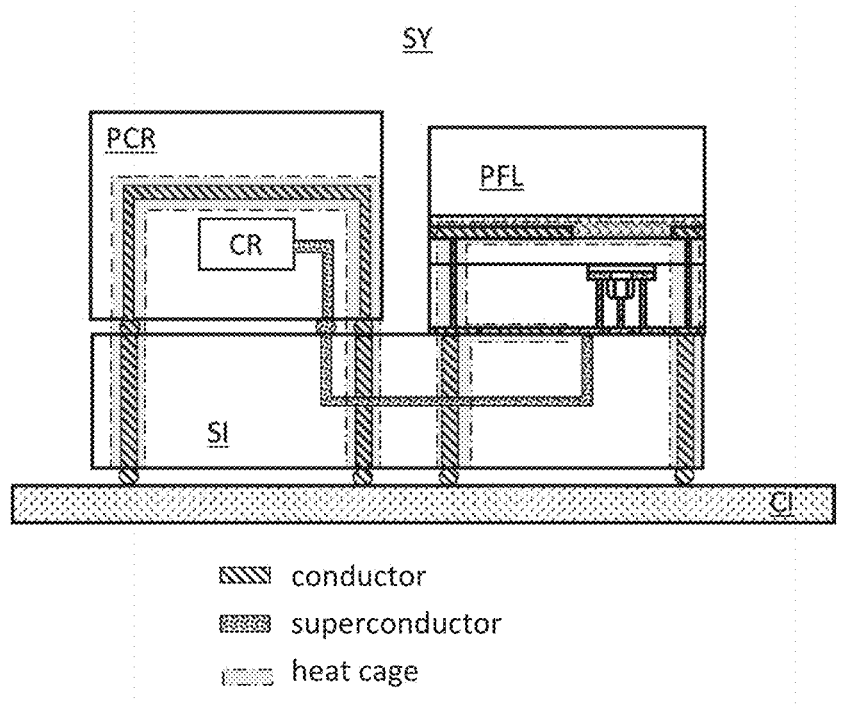
[Fig. 21]
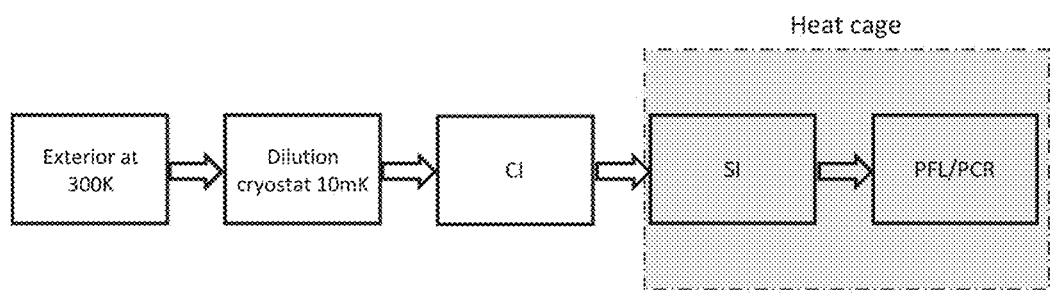

CHIP WITH BIFUNCTIONAL ROUTING AND ASSOCIATED METHOD OF MANUFACTURING

CROSS-REFERENCE TO RELATED APPLICATIONS

This application claims priority to French Patent Application No. 2009541, filed Sep. 21, 2020, the entire content of which is incorporated herein by reference in its entirety.

FIELD

The technical field of the invention is that of micro and nano systems and of the assembly thereof in the framework of quantum computing.

The present invention relates to an integrated structure intended to receive control chips and functional chips and in particular an integrated structure comprising a bifunctional routing: thermal and electrical.

BACKGROUND

For applications relatives to quantum computing, micro or nano systems generally operate at very low temperatures (about a few Kelvin (K) even a few mK) which are obtained thanks to dilution cryostats. The thermal management of the elements that these systems are comprised of or their packaging differs completely from what is done at ambient temperature, i.e. at about 300 K. Indeed, the contribution of phonons in thermal conduction attenuating at $T^3$ where T is the temperature considered, thermalisation at these very low temperatures is done mostly by electronic thermal conductivity. Generally, the integrated structures of the prior art do not take advantage of this particularity in order to thermally insulate the various elements of an assembly.

For example, in document US2019/0273197 A1, the various chips of the assembly are connected together by means of conductor tracks in such a way that there is a thermal coupling between the various chips. This thermal coupling can be particularly problematic when one or more chips are heat sensitive. Another example is given in document WO2018/052399 A1 wherein the connection between the chips and the integrated structure can be made through a superconductor connection bump. Although such a configuration effectively makes it possible to thermally insulate the chips between them, the chips are also insulated from the cryostat which does not allow for good thermalisation of the latter.

Furthermore, in the two preceding examples, the connection of the chips is done by means of bumps. However, using bumps limits the integration density, manufacturing techniques imposing bump sizes and inter-bump distances that it is very difficult to reduce.

There is therefore a need for an integrated structure that allows for good thermalisation of chips while still ensuring good thermal insulation of the chips between them. There is also a need for a method of assembly that makes it possible to benefit from the advantages of such an insulation while still overcoming the integration limits associated with the use of bumps. Finally, there is a need for a chip that can take advantage of such an integrated structure.

SUMMARY

The invention offers a solution to the problems mentioned hereinabove, by proposing an integrated structure with a bifunctional routing: certain routing tracks providing a thermal and electrical function (the conductor routing tracks) and certain tracks providing only an electrical function (the superconductor routing tracks). The term "thermal function" means allowing a thermalisation or guaranteeing the maintaining of the target cryogenic temperature of the object to be thermalised. The term "electrical function" means transmitting electrical signals between the various elements of the integrated structure.

For this, a first aspect of the invention relates to an integrated structure intended to connect a plurality of semiconductor devices, the integrated structure comprising a substrate, a first face and a second face, the first face being intended to receive the semiconductor devices, the integrated structure comprising, at the first face, at least one routing level, the routing level or levels comprising:
  at least one first conductor routing track in a conductor material; and
  at least one first superconductor routing track made from a superconductor material.

The term "the routing level or levels comprising" means that when a single routing level is present, it comprises at least one first conductor routing track and at least one first superconductor routing track; but when several routing levels are present, the first conductor routing track can be on a first routing level while the first superconductor routing track can be on a second routing level.

Thanks to the invention, it becomes possible to carry out multi-chip assemblies with a bifunctional routing. This bifunctional routing makes it possible to position a thermal insulation between the various chips connected to the integrated structure, the communication between chips able to be done via superconductor routing tracks and the thermalisation able to be done via conductor routing tracks, for example to create individual heat cages at each chip in such a way as to insulate them thermally from one another.

In addition to the characteristics that have just been mentioned in the preceding paragraph, the integrated structure according to a first aspect of the invention can have one or more additional characteristics among the following, taken individually or according to any technically permissible combinations.

Beneficially, the integrated structure comprises a plurality of routing levels, the routing levels of the plurality of routing levels being connected, between routing tracks of the same type, by means of inter-level vias of the same type. In other words, the conductor routing tracks will be connected by means of inter-level conductor vias and the superconductor routing tracks will be connected by means of inter-level superconductor vias.

Beneficially, the first routing level comprises only one or more superconductor routing tracks.

Beneficially, the integrated structure comprises a plurality of conductor through vias making it possible to connect, from the second face of the integrated structure, the conductor routing tracks located on the first face of the integrated structure.

A second aspect of the invention relates to an assembly comprising an integrated structure according to a first aspect of the invention and at least one semiconductor device, the semiconductor device comprising a front face and a rear face, the rear face comprising at least one conductor routing track and a superconductor routing track, the assembly also comprising first connection device connecting the conductor routing tracks of the integrated structure to the conductor routing tracks of the semiconductor device and second connection device connecting the superconductor routing tracks of the integrated structure to the superconductor routing tracks of the semiconductor device.

In addition to the characteristics that have just been mentioned in the preceding paragraph, the assembly according to a second aspect of the invention can have one or more additional characteristics among the following, taken individually or according to any technically permissible combinations.

Beneficially, the first connection device is or includes conductor bumps and the second connection is or includes superconductor bumps.

Beneficially, alternatively, the first connection device includes pads made from a conductor material and the second connection device includes pads made from a superconductor material.

Beneficially, alternatively, the first connection device includes pads each comprising:
- a first layer of a conductor material;
- a second layer of a superconductor conductor material; and
- a third layer of a conductor material;

and the second connection device includes pads made from a superconductor material.

In these two alternative embodiments, the bumps are therefore replaced with pads. Thus, these two embodiments wherein a direct conductor-conductor and superconductor-superconductor bonding (in the first alternative embodiment) or direct superconductor-superconductor bonding (in the second alternative embodiment) is used make it possible to consider high-density integrations patterns with pitches between interconnections less than the micrometre. This benefit makes it possible in particular to consider a large-scale integration of the silicon spin qubits of which the devices are not large with a typical surface of 100 nm$^2$ per qubit compared to 100 µm$^2$ per qubit for superconductor qubits for example. For these two alternative embodiments, the term "of a conductor/superconductor material" can here designate a plurality of layers of the same material that, after bonding, forms only one single layer of this material.

A third aspect of the invention relates to a method of assembly between an integrated structure according to a first aspect of the invention and a semiconductor device, the integrated structure comprising, on its first face, a first plurality of conductor connection pads and a first plurality of superconductor connection pads, the semiconductor device comprising a front face and a rear face, the rear face comprising a second plurality of conductor connection pads configured in such a way as to be able to be facing the first plurality of conductor connection pads and a second plurality of superconductor connection pads configured in such a way as to be able to be placed facing the first plurality of superconductor connection pads, said connection pads being formed in a layer of a dielectric material, the method comprising, carried out at the first face of the integrated structure and of the rear face of the semiconductor device:
- a step of chemical mechanical polishing to the surface of the layer of a dielectric material present on the first face of the integrated structure and on the rear face of the semiconductor device;
- a step of putting the first face of the integrated structure in contact with the rear face of the semiconductor device, the connection pads of the integrated structure being put into correspondence with the connection pads of the semiconductor device;
- a step of annealing or thermocompression in such a way as to glue the connection pads together.

This method of assembly wherein a direct bonding (superconductor-superconductor and conductor-conductor) is used makes it possible to consider high-density integration patterns with pitches between interconnections less than or equal to the micrometre. This benefit makes it possible in particular to consider a large-scale integration of the silicon spin qubits of which the devices are not large with a typical surface of 100 nm$^2$ per qubit compared to 100 µm$^2$ per qubit for superconductor qubits for example.

In an embodiment, the method comprises, before the step of chemical mechanical polishing:
- a step of selective etching of the connection pads, for example by chemical mechanical polishing, in such a way as to form a recess with respect to the surface of the layer of a dielectric material wherein the connection pads are formed;
- a step of depositing, for example a solid plate deposition via PVD, a layer of a superconductor material, the thickness of the layer deposited being comprised between 50 and 100 nm.

In this embodiment, during the step of annealing or thermocompression, the connection pads are glued together via the layer of a superconductor material deposited during the deposition step of a layer of a superconductor material. This layer of a superconductor material facilitates the step of chemical mechanical polishing, the same material being present on all the connection pads.

A fourth aspect of the invention relates to a functional chip comprising:
- a substrate comprising a first face and a second face, the second face of the substrate forming the front face of the functional chip;
- a first oxide layer on the first face of the substrate;
- a second oxide layer on the first oxide layer;
- a first routing level formed on the surface of the second oxide layer in contact with the first oxide layer;
- a third oxide layer on the second oxide layer wherein at least one semiconductor component is inserted;
- a rear face formed by the surface of the third oxide layer opposite the second oxide layer, the rear face comprising a plurality of superconductor routing tracks surrounded at least partially by one or more conductor routing tracks, the semiconductor component being connected to the superconductor routing tracks via superconductor vias and the conductor routing tracks of the rear face being connected to the routing level via conductor vias.

Thus, the conductor tracks located on the front face and on the rear face and the conductor through vias form a heat cage around the semiconductor component.

Beneficially, the semiconductor device is a qubit.

Beneficially, the qubit is a silicon spin qubit.

Beneficially, the routing tracks of the front face and the routing tracks of the rear face are disposed in such a way that the projections of the routing tracks of the front face on the rear face do not intersect the routing tracks of the rear face.

Beneficially, the routing tracks of the front face have a width and/or a spacing comprised between 50 nm and 500 µm.

Beneficially, the routing tracks of the rear face have a width and/or a spacing comprised between 50 nm and 10 µm.

Beneficially, the minimum distance between each conductor routing track is comprised between 5 µm and 10 µm, regardless of the routing level considered.

Beneficially, the distance between the conductor tracks and the semiconductor component is greater than or equal to 100 µm.

Beneficially, the percentage of the surface of conductor tracks of the first routing level facing a conductive track of the second routing level is less than or equal to 10% of the total surface of the first routing level.

A fifth aspect of the invention relates to a method for manufacturing a functional chip according to a fourth aspect of the invention from a starting structure comprising a substrate, for example a silicon substrate, a layer of oxide referred to as third oxide layer, a semiconductor component formed in the third oxide layer and a second oxide layer on which the third oxide layer rests, the method comprising:
- a step of forming routing tracks on a first face, referred to as rear face, the superconductor routing tracks being in electrical contact with the semiconductor component via superconductor vias already present in the starting structure;
- a step of depositing a layer of oxide on the rear face so as to obtain good planarity;
- a step of bonding the rear face on a silicon handle followed by a turning over of the unit thus formed;
- a step of thinning the substrate;
- a step of creating conductor vias connecting the conductor routing tracks located on the rear face;
- a step of creating conductor tracks at the second face, referred to as front face, in such a way as to form a first conductor routing level;
- a step of depositing on the second face a layer of oxide, referred to as first oxide layer, so as to obtain good planarity;
- a step of bonding the second face on a silicon handle;
- a step of removing the first handle.

Beneficially, the step of thinning the substrate comprises:
- a step of grinding, said step of grinding being stopped when the grinder is at a distance of about a µm from the second oxide layer;
- a substep of wet etching in such a way as to remove the remainder of the substrate and this clear the second oxide layer at a second face opposite the first face.

A sixth aspect of the invention relates to a system comprising a printed circuit and an assembly according to a second aspect of the invention, the assembly being connected to the printed circuit via the integrated structure of said assembly, the assembly comprising at least one first semiconductor device in the form of a functional chip and a second semiconductor device in the form of a control chip, the control chip being connected to the functional chip via the integrated structure by means of superconductor routing tracks.

Beneficially the functional chip is a functional chip according to fourth aspect of the invention.

The invention and its different applications shall be better understood when reading the following description and when examining the accompanying figures.

BRIEF DESCRIPTION OF THE FIGURES

The figures are present for the purposes of information and in no way limit the invention.

FIG. 1 shows a first integrated structure according to the invention.

FIG. 2 shows a second integrated structure according to the invention.

FIG. 3 (FIG. 3A-C) shows the creation of future conductor through vias in the substrate of the integrated structure.

FIG. 4 (FIG. 4A-C) shows the creation of buried routing tracks.

FIG. 5 (FIG. 5A-C) shows the creation of the inter-level conductor vias.

FIG. 6 (FIG. 6A-C) shows the creation of the conductor routing tracks on the first surface of the integrated structure.

FIG. 7 (FIG. 7A-C) shows the creation of superconductor routing tracks on the first surface of the integrated structure.

FIG. 8 (FIG. 8A-E) shows the creation of the conductor routing tracks on the rear face of the integrated structure.

FIG. 9 shows an integrated structure according to the invention comprising two routing levels on the front face and one routing level on the rear face.

FIG. 10 (FIG. 10A-C) shows the different possible connection modes between the integrated structure and a printed circuit.

FIG. 11 shows a first connection mode between an integrated structure according to the invention and a semiconductor device.

FIG. 12 (FIG. 12A-C) shows the creation of superconductor bonding pads on the first surface of an integrated structure according to the invention.

FIG. 13 shows a second connection mode between an integrated structure according to the invention and a semiconductor device.

FIG. 14 (FIG. 14A-B) shows a semiconductor device including a qubit protected by means of a heat cage.

FIG. 15 (FIG. 15A-H) shows the various steps of manufacturing a functional chip according to the invention.

FIG. 16 shows a first connection configuration of several semiconductor devices on an integrated structure according to the invention.

FIG. 17 shows a second connection configuration of several semiconductor devices on an integrated structure according to the invention.

FIG. 18 shows a third connection configuration of several semiconductor devices on an integrated structure according to the invention.

FIG. 19 shows a fourth connection configuration wherein the integrated structure is configured to operate as a control chip.

FIG. 20 shows an embodiment of an assembly according to the invention.

FIG. 21 shows a schematic representation of the cooling (or thermalisation) circuit of a dilution cryostat wherein an integrated structure according to the invention is intended to be mounted.

DETAILED DESCRIPTION

In the rest of the description, a material will be considered as superconductor if the latter has a critical temperature greater than or equal to 4 K. The superconductor material can for example be chosen from niobium (Nb), niobium nitride (NbN), titanium nitride (TiN), tantalum nitride (TaN), tantalum (Ta), vanadium (V), niobium alumina ($Nb_3Al$), alloys of tin-niobium ($Nb_3Sn$), titanium-niobium (NbTi) or with a vanadium and silicon ($V_3Si$) base. In an embodiment, the superconductor material is compatible with a method of chemical mechanical polishing, which in particular includes niobium, niobium nitride, titanium nitride or tantalum nitride.

Integrated Structure SI

A first aspect of the invention shown in FIG. 1 and in FIG. 2 relates to an integrated structure SI intended to be connected to a semiconductor device DS or to a plurality of semiconductor devices DS. The integrated structure SI comprises a substrate SB, a first face SIS1 and a second face SIS2, the first face SIS1 being intended to receive the semiconductor devices DS, the integrated structure SI comprising, at the first face SIS1, desirably arranged in a layer of a dielectric material DE, a first routing level 1NR, the first routing level 1NR comprising at least one first conductor routing track PC in a conductor material and at least one first superconductor routing track PS made from a superconductor material. In addition, each routing track PS, PC, whether it is conductor or superconductor, can also comprise one or more connection zones ZCC, ZCS. Connection bumps, for example, can afterwards be deposited at these connection zones ZCC, ZCS.

In an embodiment, the substrate SB is made of silicon or of epoxy. In an embodiment, the first SIS1 and second SIS2 faces have a surface comprised between 1 mm$^2$ and 1,600 mm$^2$, desirably of square shape. In an embodiment, the thickness of the substrate SB is comprised between 50 μm and 1,000 μm.

As shown in FIG. 2, the integrated structure SI can have several routing levels 1NR, 2NR. In this FIG. 2, a second routing level 2NR is present and comprises a second conductor routing track PC2, connected to the first conductor routing track PC by means of an inter-level conductor via VIC as well as a second superconductor routing track PS2, connected to the first superconductor routing track PS by means of an inter-level superconductor via VIS. More generally, the conductor routing tracks of different routing levels are connected together by inter-level conductor vias VIC while the superconductor routing tracks of different routing levels are in an embodiment connected together by inter-level superconductor vias VIS. Additional routing levels can of course be present, each routing level able to comprise one or more conductor routing tracks PC and/or one or more superconductor routing tracks PS. Thus, a routing level can comprise one or more routing tracks of the two types (conductor PC and superconductor PS) or then of a single type (conductor PC and superconductor PS). It will also be possible to choose a configuration wherein each routing level comprises only one type of routing tracks, the conductor routing tracks PC then being on different routing levels of superconductor routing tracks PS. In any case, the first routing level 1NR located at the first surface SIS1 of the integrated structure SI will always comprise at least one superconductor routing track PS, desirably a plurality of superconductor routing tracks PS.

In other words, an integrated structure SI according to the invention comprises one or more conductor routing tracks PC and/or one or more superconductor routing tracks PS at the first surface of the integrated structure SI. In order to connect these routing tracks from the second surface SIS2 of the integrated structure SI, the latter can also comprise a plurality of conductor through vias VT, the latter passing through the substrate SB in such a way as to connect the second surface SIS2 of the integrated structure SI to the conductor track PC or to the conductor tracks PC of the lowest routing level (i.e. closest to the substrate SB) of the integrated structure SI. Finally, when several routing levels are present, the integrated structure SI comprises one or more inter-level conductor and/or superconductor vias VI connecting two successive routing levels.

For the purposes of illustration, examples of a method for manufacturing that makes it possible to obtain these different elements shall now be given. Of course, other methods can be considered.

Manufacture of the Conductor Through Vias VT

In an embodiment shown in FIG. 3A-C, the creation of conductor vias VT is carried out from a substrate SB (shown in FIG. 3A) comprising a front face SBA (which will correspond to the first face SIS1 of the integrated structure SI) and a rear face SBR (which will correspond to the second face SIS2 of the integrated structure SI) and comprises:
- a step of lithography in such a way as to define, on the front face SBA of the substrate SB, zones corresponding to the sections of the vias to be created;
- a step of etching zones defined during the preceding step of lithography in such a way as to form holes over a portion of the thickness of the substrate SB, for example over a depth of 100 μm;
- a step of depositing a layer of a dielectric material DE on the front face SBA of the substrate SB (shown in FIG. 3B);
- a step of depositing, for example via physical vapour deposition (PVD), an adhesion layer, for example a layer of titanium, on the front face SBA of the substrate SB;
- a step of depositing, for example via PVD, a barrier layer, for example a layer of titanium nitride, on the front face SBA of the substrate SB;
- a step of depositing, for example via PVD, a sublayer of a metal, for example copper, on the front face SBA of the substrate SB;
- a step of filling, for example by electrolysis, holes with a metal, for example copper, in such a way as to obtain conductor vias VT;
- a step of chemical mechanical polishing (CMP) at the front face SBA of the substrate, to the layer of a dielectric material DE, i.e. until complete removal of the adhesion layer, the barrier layer and the layer of copper at the front face SBA of the substrate SB.

The final result is shown in FIG. 3C. it will be appreciated that, during the deposition of the layer of a dielectric material DE, of the adhesion layer, of the barrier layer and of the sublayer, the metals are not only deposited at the front face SBA, but also on the walls of the holes formed during the step of etching. In an embodiment, the holes defined during the step of lithography have a diameter comprised between 2 μm and 90 μm. It is useful to note that the order in which the depositions of the barrier layer and of the adhesion layer are carried out with respect to one another can vary according to the integration methods used.

Manufacture of Buried Routing Tracks

In an embodiment, the integrated structure SI comprises at least two routing levels 1NR, 2NR and buried conductor PC and/or superconductor PS routing tracks, for example carried out using a Damascene method well known to those skilled in the art. More particularly, starting with the structure obtained at the end of the manufacturing of the conductor through vias VT described hereinabove, the method for carrying out buried conductor PC2 or superconductor PS2 routing tracks shown in FIG. 4A-C (the left part showing the case of a conductor routing track PC2 and the right part showing the case of a superconductor routing track PS2) comprises:
- a step of depositing a second layer of a dielectric material DE on the layer of a dielectric material already present on the front face SBA of the substrate SB (shown in FIG. 4A—the layer of a dielectric material already present was deposited during the manufacture of the conductor through vias VT);
- a step of lithography in such a way as to define the zone or zones wherein the conductor PC2 or superconductor PS2 routing track or tracks will be formed in the second layer of a dielectric material DE;

a step of etching, over the entire thickness of the second layer of a dielectric material DE, zones defined during the step of lithography (shown in FIG. 4B);

a step of depositing an adhesion layer (for example titanium for the conductor routing tracks or tantalum for the superconductor routing tracks), the layer having a thickness less than the thickness of the second layer of a dielectric material DE;

a step of depositing a barrier layer (for example of titanium nitride when the adhesion layer is made of titanium or, desirably, of tantalum nitride when the adhesion layer is made of tantalum), the layer having a thickness such that the total thickness of the adhesion layer and of the barrier layer is less than the thickness of the second layer of a dielectric material DE;

when the routing track carried out is a conductor routing track PC2, a step of depositing a sublayer of a metal (for example copper) having a thickness such that the total thickness of the adhesion layer, of the barrier layer and of the sublayer of metal is less than the thickness of the second layer of a dielectric material DE;

a step of depositing a layer of a conductor material (for example copper deposited by electrolysis) or of a superconductor material (for example niobium), the deposited layer having a thickness such that the total thickness of the adhesion layer, of the barrier layer, of the metal sublayer and of the layer of a conductor or superconductor material is greater than the thickness of the second layer of a dielectric material DE;

a step of chemical mechanical polishing to the second layer of a dielectric material DE in such a way as to retain the deposited materials only in the etched portion (shown in FIG. 4C).

In an embodiment, the thickness of the barrier layer and/or of the adhesion layer is comprised between 1 nm and 50 nm when the routing track is a superconductor track and limited to a few nanometres (i.e. less than 10 nm) when the routing track is a conductor routing track in such a way that the material of the barrier layer and/or of the adhesion layer becomes conductor (and no longer superconductor) by the proximity effect with the conductor routing track PC2 deposited above. It is useful to note that the order in which the depositions of the barrier layer and of the adhesion layer are carried out with respect to one another can vary according to the integration methods used.

In an embodiment, the width of the buried routing tracks is comprised between 0.2 µm and 500 µm. In an embodiment, the thickness of the routing tracks is comprised between 50 nm and 5 µm. In an embodiment, the routing tracks occupy from 1 to 50% of the first surface SIS1 of the integrated structure SI.

As shown in the method described hereinabove, the conductor routing tracks PC2 can in particular be made of copper or tungsten. These materials have the benefit of being compatible with the methods of chemical mechanical polishing. More generally, any conductor or superconductor material can be used for the forming of conductor PC2 or superconductor PS2 routing tracks.

When the superconductor or conductor material is incompatible with a method of chemical mechanical polishing, it is possible to use an alternative method of manufacturing to carry out superconductor or conductor routing tracks. By way of example, it is possible to carry out a solid plate deposition of a layer of a superconductor or conductor material on the layer of a dielectric material DE, then to carry out a lithography in order to define the routing tracks, to then proceed with a local etching of the layer of a superconductor or conductor material and finally to carry out a stripping of the resin.

At the end of the steps that have just been described, one or more conductor PC2 or superconductor PS2 routing tracks are obtained which will then be buried during the manufacture of the inter-level conductor vias VIC, VIS which shall now be described.

Manufacture of the Inter-Level Conductor Vias VI

As already mentioned, when the integrated structure SI comprises a plurality of routing levels 1NR, 2NR, the latter are connected together using inter-level conductor vias VIC or superconductor VIS vias. In an embodiment shown in FIG. 5A-C (the left part showing the case of an inter-level conductor via VIC and the right part showing the case of an inter-level superconductor via VIS), the inter-level conductor VIC or superconductor VIS vias are carried out using a method comprising:

a step of depositing a third layer of dielectric material DE over the second layer of a dielectric material already present on the front face SBA of the substrate SB (FIG. 5A—the second layer of a dielectric material DE already present was deposited during the manufacture of the buried conductor routing tracks PC2);

a step of lithography in such a way as to define the zone or zones wherein the inter-level vias VI will be formed in the third layer of a dielectric material DE;

a step of etching, over the entire thickness of the third layer of a dielectric material DE, zones defined during the step of lithography (FIG. 5B);

a step of depositing, for example via physical vapour deposition (PVD), a layer of a metal (for example tungsten for conductor vias or tantalum for superconductor vias) having a thickness greater than the thickness of the third layer of a dielectric material DE;

a step of chemical mechanical polishing to the third layer of a dielectric material, i.e. until complete removal of the metal layer at the surface of the third layer of a dielectric material DE (FIG. 5C).

At the end of these steps, a plurality of conductor vias VIC and, optionally, inter-level superconductors VIS vias VI is obtained making it possible to connect two successive routing levels together. The conductor tracks PC of different routing levels can only be connected together by means of inter-level conductor vias VIC. The superconductor tracks PS of different routing levels are connected together by means of conductor vias VIC or, desirably, superconductor vias VIS.

Manufacture of Conductor and Superconductor Routing Tracks on the Surface of the Integrated Structure SI Once the buried routing tracks PC2, PS2 are carried out, it is still necessary to carry out the routing tracks that will be at the first surface SIS1 of the integrated structure SI. There are then two possibilities: adopt a configuration wherein the routing tracks on the surface are exclusively superconductor PS or adopt a configuration wherein the routing tracks on the surface comprise conductor routing tracks PC and superconductor routing tracks PS.

When the routing tracks on the surface are exclusively superconductor PS, the method for carrying out routing tracks on the surface comprises:

a step of depositing a fourth layer of a dielectric material DE on the third layer of a dielectric material DE already present on the front face SBA of the substrate SB (the third layer of a dielectric material already present was deposited during the manufacture of the inter-level conductor vias VI);

a step of lithography in such a way as to define the zone or zones wherein the superconductor routing track or tracks PS will be formed in the fourth layer of a dielectric material DE;

a step of etching, over the entire thickness of the fourth layer of a dielectric material DE, zones defined during the step of lithography;

a step of depositing, for example via PVD, an adhesion layer (desirably made of tantalum) having a thickness less than the thickness of the fourth layer of a dielectric material DE;

a step of depositing, for example via PVD, a barrier layer (desirably made of tantalum nitride) having a thickness such that the total thickness of the adhesion layer and of the barrier layer is less than the thickness of the fourth layer of a dielectric material DE;

a step of depositing, for example via PVD, a layer of a superconductor material having a thickness such that the total thickness of the adhesion layer, of the barrier layer and of the layer of a superconductor material is greater than the thickness of the fourth layer of a dielectric material DE;

a step of chemical mechanical polishing to the surface of the fourth layer of a dielectric material DE, i.e. until complete removal of the adhesion layer, of the barrier layer and of the layer of a superconductor material at the surface of the fourth layer of a dielectric material.

It is useful to note that the order in which the deposition of the barrier layer and the deposition of the adhesion layer are carried out with respect to one another can vary according to the integration methods used.

In an alternative embodiment, when the routing tracks comprise conductor routing tracks PC and superconductor routing tracks PS, the method for carrying out routing tracks on the surface shown in FIG. 6A-C (creation of conductor routing tracks) and in FIG. 7A-C (creation of superconductor routing tracks) comprises a first phase of carrying out conductor routing tracks PC (FIG. 6A-C) which comprises:

a step of depositing a fourth layer of a dielectric material on the third layer of a dielectric material already present on the front face SBA of the substrate SB (FIG. 6A—the third layer of a dielectric material already present was deposited during the manufacture of the inter-level conductor vias VIC and/or superconductor vias VIS);

a step of lithography in such a way as to define the zone or zones wherein the conductor routing track or tracks PC will be formed in the fourth layer of a dielectric material;

a step of etching, over the entire thickness of the fourth layer of a dielectric material, zones defined during the step of lithography (FIG. 6B);

a step of depositing, for example via PVD, an adhesion layer (desirably made of titanium) having a thickness less than the thickness of the fourth layer of a dielectric material;

a step of depositing, for example via PVD, a barrier layer (desirably made of titanium nitride) having a thickness such that the total thickness of the adhesion layer and of the barrier layer is less than the thickness of the fourth layer of a dielectric material;

a step of depositing, for example via PVD, a sublayer of a metal (for example copper) having a thickness such that the total thickness of the adhesion layer, of the barrier layer and of the sublayer of metal is less than the thickness of the fourth layer of a dielectric material;

a step of depositing, for example by electrolysis, a layer of a metal in the etched zones having a thickness such that the total thickness of the adhesion layer, of the barrier layer, of the sublayer of a metal and of the layer of a metal is greater than the thickness of the fourth layer of a dielectric material;

a step of chemical mechanical polishing to the fourth layer of a dielectric material, i.e. until complete removal of the adhesion layer, of the barrier layer, of the sublayer of a metal and of the layer of a metal at the surface of the fourth layer of a dielectric material (FIG. 6C);

It is useful to note that the order in which the deposition of the barrier layer and the deposition of the adhesion layer are carried out with respect to one another can vary according to the integration methods used.

It also comprises a second phase (FIG. 7A-C) for carrying out superconductor routing tracks PS which comprises:

a step of depositing a barrier layer CA, for example made from SiN, on the fourth layer of a dielectric material (FIG. 7A);

a step of lithography in such a way as to define the zone or zones wherein the superconductor routing track or tracks PS will be formed in the fourth layer of a dielectric material DE;

a step of etching, over the entire thickness of the barrier layer and of the fourth layer of a dielectric material DE, zones defined during the step of lithography (FIG. 7B);

a step of depositing, for example via PVD, an adhesion layer (desirably made of tantalum) having a thickness less than the thickness of the fourth layer of a dielectric material DE;

a step of depositing, for example via PVD, a barrier layer (desirably made of tantalum nitride) having a thickness such that the total thickness of the adhesion layer and of the barrier layer is less than the thickness of the fourth layer of a dielectric material DE;

a step of depositing, for example via PVD, a layer of a superconductor material having a thickness such that the total thickness of the adhesion layer, of the barrier layer and of the layer of a superconductor material is greater than the thickness of the fourth layer of a dielectric material;

a step of CMP to the barrier layer then, in a second step, to the fourth layer of a dielectric material DE, i.e. until complete removal of the barrier layer, of the adhesion layer, of the barrier layer and of the layer of a superconductor material at the surface of the fourth layer of a dielectric material (FIG. 7C).

It is useful to note that the order in which the deposition of the barrier layer and the deposition of the adhesion layer are carried out with respect to one another can vary according to the integration methods used.

In an embodiment, the thickness of the barrier layer and/or of the adhesion layer is comprised between 1 nm and 50 nm when the routing track is a superconductor track and limited to a few nanometres (i.e. less than 10 nm) when the routing track is a conductor routing track in such a way that the materials of the barrier layer and/or of the adhesion layer become conductor (and no longer superconductors) by the proximity effect with the conductor routing track PC deposited above.

In an embodiment, the width of the routing tracks is comprised between 0.2 μm and 500 μm. In an embodiment, the thickness of the routing tracks is comprised between 50 nm and 5 µm. In an embodiment, the routing tracks occupy from 1 to 50% of the first surface SIS1 of the integrated structure SI. Note that the superconductor routing tracks PS, PS2 (buried or not) are never connected to the conductor routing tracks PC or to the conductor through vias VT.

Finalization of the Conductor Through Vias VT

So that the conductor routing tracks PC, PC2 at the front face SBA of the substrate SB can be connected from the rear face SBR of the substrate SB, it is suitable to render the conductor through vias VT accessible from the rear face SBR. For this, in an embodiment shown in FIG. 8A-E, the carrying out of an integrated structure SI also comprises:

- a step of thinning the rear face of the substrate SB in such a way that the distance separating the bottom of the conductor vias VT and the rear face SBR of the substrate SB is less than or equal to 10 µm;
- a step of selective dry etching of the substrate SB in such a way as to expose the conductor through vias VT (FIG. 8A);
- a step of depositing a layer of a dielectric material DE in such a way as to coat the exposed portion of the conductor through vias VT;
- a step of chemical mechanical polishing in such a way as to render the conductor through vias VT flush at the rear face SBR of the substrate SB (FIG. 8B);
- a step of depositing, for example via PVD, an adhesion layer (desirably made of titanium) having a thickness less than the thickness of the layer of a dielectric material DE;
- a step of depositing, for example via PVD, a sublayer of a metal (for example copper) having a thickness less than the thickness of the layer of a dielectric material
- a step of photolithography in such a way as to define the zone or zones wherein the conductor routing track or tracks PC will be formed at the rear face SBR of the substrate SB;
- a step of depositing a layer of a metal (for example copper) in the zones defined during the step of lithography;
- a step of stripping the resin used during the step of lithography;
- a step of etching in such a way as to remove the adhesion layer and the metal sublayer present outside the zones defined during the step of lithography (FIG. 8C);
- a step of spreading a passivation layer PA (for example made of polyimide or of resin) on the rear face SBR of the substrate SB (FIG. 8D);
- a step of lithography in such a way as to define in the passivation layer PA opening zones OR for the connections making it possible to connect the routing tracks (FIG. 8E).

In an embodiment, it is possible to carry out a metallisation of the connection zones ZC, so as in particular to protect the latter from oxidation. This metallisation can for example include three layers of different metals, for example titanium, nickel and gold. The carrying out of this metallisation can be done via a deposition of the different layers of metals, followed by a lithography of the metallisation zones, then an etching of the layers of metals outside these zones and finally the removal of the resin used during the lithography.

In an embodiment, the step of thinning is carried out in such a way as to leave a thickness of substrate SB comprised between 50 µm and 300 µm. In an embodiment, the density of the conductor through vias VT is comprised between 0.05% and 4% of the surface of the integrated structure SI. In an embodiment, the conductor through vias VT density in the transfer zone report (i.e. the zone comprising the conductor ZCC and superconductor ZCS connection zones) of the integrated structure SI intended to receive the semiconductor devices DS is greater than the density in the other zones of the integrated structure SI and at least equal to 1% in such a way as to favour the thermal exchanges between the first face SIS1 and the second face SIS2 of the integrated structure.

The integrated structure SI obtained at the end of these steps is shown in FIG. 9. The latter allows for a routing that ensure two distinct functions: an electrical routing and a thermal routing between the different elements (semiconductor devices, interposer, etc.) connected to the integrated structure SI. Indeed, the electrical function is provided by the superconductor routing track or tracks PS coupling the various elements connected to the integrated structure through one or more routing levels of the integrated structure SI. The Cooper pairs providing the electronic transport in these routing tracks PS do not conduct heat and therefore make it possible to thermally insulate these elements between them. The thermal function is provided by the conductor routing track or tracks PC in such a way as to allow for the individual thermalisation of the various elements connected to the integrated structure SI.

Such a "bifunctional" routing (electrical and thermal) is in particular beneficial for the large-scale packaging of silicon spin qubits. Indeed, the high density of gates required for the operation and the reading of the qubits is controlled by chips of the dedicated CryoCMOS type and embarked in the vicinity of the qubits to be controlled, for example on the same interposer or on the same integrated structure SI. Using a superconductor routing between the qubits chips and the CryoCMOS makes it possible to optimize the electric signals while still suppressing the Joule effect caused by these tracks, providing a source of heat at least in the structure, and by thermally insulating these chips between them.

Connection Between the Integrated Structure SI and a Printed Circuit

An integrated structure SI according to the invention is intended to be mounted in a dilution cryostat. For this, the integrated structure SI is in general fastened to a printed circuit CI, the mixing box of the cryostat at about 10 mK on which the printed circuit is fastened ensuring the cooling of the latter and therefore of the integrated structure SI.

A first connection mode of the integrated structure SI to the printed circuit is shown in FIG. 10A. In this figure, the integrated structure SI is fastened to a printed circuit CI at its second surface SIS2, the conductor routing tracks located on its first surface SIS1 then being connected via connection wires CF, for example using one or more microwelds. Thus, only the first surface SIS1 of the integrated structure SI is used for the purposes of electrical and thermal connection, the second surface SIS2 being used only for the mechanical connection with the printed circuit CI. In particular, in this configuration, the thermalisation is carried out by the conductor connections connecting, via the conductor routing track or tracks PC located on the first surface SIS1, the integrated structure SI to the printed circuit CI and therefore, indirectly, to the mixing box. In addition, the connection being done at the first surface SIS1 of the integrated structure SI, the presence of through vias VT is not necessary.

A second connection mode of the integrated structure SI to the printed circuit CI is shown in FIG. 10B. In this embodiment, the integrated structure SI is connected to the printed circuit CI at its second surface SIS2 via conductor bumps BI. The electrical and thermal coupling is then ensured by the conductor through vias VT between the second surface SIS2 (and therefore the printed circuit CI)

and the routing level closest to the substrate SB at the first surface SIS1 of the integrated structure SI.

In an embodiment, the bumps are created on the connection zones ZC of the second face SIS2 of the integrated structure SI using a method comprising:
- a step of depositing an adhesion layer (for example a layer of titanium) on the passivation layer PA (recall, the passivation layer was opened via photolithography so as to define connection zones ZC);
- a step of lithography in such a way as to define the zones wherein the conductor bumps will be formed;
- a step of depositing, for example by electrolysis, a layer of a first metal (for example copper)
- a step of depositing a layer of a second metal (for example nickel)
- a step of depositing a layer of a third metal (for example a tin-silver alloy or a tin-silver-copper alloy);
- a step of etching the adhesion layer and the layers of a first, second and third metal to the surface of the passivation layer PA;
- a step of thermal annealing in such a way as to form the conductor bumps BI.

In an embodiment, the diameter of the conductor bumps BI is comprised between 10 μm and 500 μm (this diameter being defined by the diameter of the connection zones ZC on which the bumps are formed) and the thickness of the conductor bumps is comprised between 5 μm and 500 μm, the minimum pitch between each bump being equal to 20 μm.

In an embodiment shown in FIG. 10C, the fastening of the integrated structure SI to the printed circuit CI is done via a mechanical support SM. The support comprises a plurality of conductor through vias VI2 making it possible to make the connection between each surface of the mechanical support SM. The mechanical support SM is fastened to the printed circuit CI via conductor bumps BI2 such as described hereinabove. The integrated structure SI is fastened to the mechanical support SM via conductor bumps BI, in the same way as described in the preceding embodiment. The mechanical support SM makes it possible to ensure the mechanical robustness of the integrated structure SI in the case where the substrate SB that the latter comprises is thinned. In addition this mechanical support SM can constitute the elementary brick of packaging structures of the "ball grid array" or "land grid array" type. In this case here, the mechanical support SM can allow for the flaring of the connections by one or more conductor routing levels associated with the conductor through vias VI2. These packaging structures in particular have the benefit of facilitating and accelerating the measurements of devices with a large number of connections.

Connection Between the Integrated Structure and a Semiconductor Device

An integrated structure SI according to the invention is intended to receive one or more semiconductor devices DS. Generally, as shown in FIG. 11, in FIG. 12 and in FIG. 13, a semiconductor device DS intended to be connected to an integrated structure SI according to the invention comprises a front face FA and a rear face FR. It generally comprises, at its rear face FR, two connection types: one or more conductor connections CC and one or more superconductor connections CS. These connections CC, CS are intended to be connected to the connection zones ZCC, ZCS of the routing tracks PC, PS of the same type located on the first surface SIS1 of the integrated structure SI.

As shall now be described, this connection can be carried out in several ways. In the drawings showing the connection of an integrated structure SI according to the invention to one or more semiconductor devices DS, in order to avoid unnecessary complexity of the figures, the representation of the integrated structure SI has been simplified so as to allow to appear only the connection zones ZCS, ZCC of the conductor PC and superconductor PS routing tracks at its first surface SIS1.

By Means of Conductor and Superconductor Bumps

In a first embodiment shown in FIG. 11, the semiconductor device or devices DS are connected to the integrated structure SI by means of conductor bumps CBI and superconductor bumps SBI. More particularly, at the first surface SIS1 of the integrated structure SI, interconnection bumps CBI, SBI are carried out above the routing tracks PC, PS in a material of the same type as the routing track located below the bumps (an interconnection bump CBI located above a conductor routing track PC will be a conductor bump CBI; likewise an interconnection bump SBI located above a superconductor routing track PS will be a superconductor bump SBI). In FIG. 11, as already mentioned, the semiconductor device DS comprises a front face FA and a rear face FR. A plurality of connections CC, CS are located on its rear face FR, some being conductor connections CC and others being superconductor connections CS. Each superconductor connection CS of the semiconductor device DS is connected by means of a bump SBI made from a superconductor material to a superconductor connection zone ZCS located on the first surface SIS1 of the integrated structure SI. In the same way, each conductor connection CC of the semiconductor device DS is connected by means of a bump CBI in a conductor material to a conductor connection zone ZCC located on the first surface SIS1 of the integrated structure SI.

To facilitate the method of manufacture and avoid the steps of lithography on surfaces with substantial morphology, bumps of a different type are desirably carried out on different surfaces of the assembly. For example, the conductor bumps CBI are carried out on the rear face FR of the semiconductor device DS while the superconductor bumps SBI are carried out on the first surface SIS1 of the integrated structure SI (or vice versa).

It is first of all desirable to form, at the first surface SIS1 of the integrated structure SI, a conductor metallisation under-bump intended to provide the connection with the conductor bumps located on the rear face of the semiconductor device DS intended to be connected to the integrated structure SI, but also a superconductor metallisation under-bump on which the superconductor bumps SBI will be formed.

For this, the creation of the conductor metallisation under-bump and of the superconductor metallisation under-bump comprises, at the first surface SIS1 of the integrated structure SI:
- a step of depositing a passivation layer (for example in a dielectric material);
- a step of lithography in such a way as to define the zone or zones wherein the superconductor metallisation under-bump and the conductor metallisation under-bump will be formed in the passivation layer;
- a step of etching, over the entire thickness of the passivation layer, zones defined during the step of lithography;
- a step of depositing, for example via PVD, a layer of a superconductor metal (for example made of titanium nitride or tantalum nitride) of a thickness less than the thickness of the passivation layer;

a step of lithography in such a way as to define the zone or zones wherein the superconductor metallisation under-bump will be formed in the passivation layer;

a step of etching the layer of a superconductor metal outside the zones defined during the preceding step of lithography;

a step of depositing, for example via PVD, an adhesion layer (for example made of titanium);

a step of depositing, for example via PVD, a sublayer of conductor metal (for example made of copper) of a thickness such that the total thickness of the adhesion layer and of the metal sublayer is less than the thickness of the passivation layer;

a step of lithography in such a way as to define the zone or zones wherein the conductor metallisation under-bump will be formed in the passivation layer;

a step of depositing, in the zones defined during the step of lithography, for example by electrolysis, a stack of conductor metals that can include copper, nickel and ending desirably with gold;

a step of etching the adhesion layer and the conductor metal sublayer.

Once the conductor and superconductor metallisation under-bumps carried out on the first face SIS1 of the integrated structure SI, it is suitable to form the superconductor bumps SBI at the superconductor metallisation under-bump zones defined hereinabove. For this, in an embodiment, the manufacture of superconductor bumps SBI comprises:

a step of lithography in such a way as to define the zone or zones wherein the superconductor bumps SBI will be formed, the latter being formed above the superconductor metallisation under-bump obtained hereinabove;

a step of depositing, for example via evaporation, a layer of a superconductor material (for example indium);

a step of lifting-off in such a way as to obtain a plurality of wafers of a superconductor material;

a step of thermal annealing in such a way as to form a plurality of superconductor bumps SBI.

At the end of these steps, superconductor bumps SBI were formed on the first face SIS1 of the integrated structure SI (as shown in FIG. 11).

In an embodiment, the superconductor bumps have a diameter comprised between 5 µm and 500 µm, desirably between 10 µm and 50 µm, with a minimum pitch between each bump of 10 µm.

In the same way that was done on the integrated structure SI, a conductor metallisation under-bump, a superconductor metallisation under-bump and conductor bumps will be formed on the rear face FR of the semiconductor device DS intended to be connected to the integrated structure SI.

In an embodiment, the creation of the superconductor metallisation under-bump comprises:

a step of lithography in such a way as to define, in a passivation layer present at the rear face FR of the semiconductor device, the zone or zones wherein the superconductor metallisation under-bump and the conductor metallisation under-bump will be formed in the passivation layer already present;

a step of etching, over the entire thickness of the passivation layer, zones defined during the step of lithography;

a step of depositing, for example via PVD, a layer of a superconductor material (for example made of titanium nitride or tantalum nitride) of a thickness less than the thickness of the passivation layer;

a step of lithography in such a way as to define, in the passivation layer, the zone or zones wherein the superconductor metallisation under-bump will be formed;

a step of etching the layer of a superconductor material.

In an embodiment, the creation of the conductor metallisation under-bump and conductor bumps CBI the rear face FR of the semiconductor device DS intended to be connected to the integrated structure SI comprises:

a step of depositing an adhesion layer (for example a layer of titanium);

a step of depositing a sublayer of a metal;

a step of lithography in such a way as to define the zones wherein the conductor bumps will be formed;

a step of depositing, for example by electrolysis, a layer of a first metal (for example copper)

a step of depositing a layer of a second metal (for example nickel);

a step of depositing a layer of a third metal (for example a tin-silver alloy or a tin-silver-copper alloy);

a step of etching the adhesion layer and the sublayer of a metal to the surface of the passivation layer PA;

a step of thermal annealing in such a way as to form the conductor bumps.

In an embodiment, the diameter of the conductor bumps CBI is comprised between 10 µm and 500 µm, desirably between 10 µm and 50 µm, and the latter are spaced from one another with a minimum pitch between each bump of 20 µm.

In order to ensure good mechanical resistance of the assembly, it is desirable that the conductor bumps CBI and the superconductor bumps SBI be sized in the same way so as to guarantee the uniformity of the thickness between the semiconductor device DS and the integrated structure SI.

In an embodiment, after the assembly of the semiconductor device DS and of the integrated structure SI, a filled resin of the thermally insulating epoxy type can be injected between the semiconductor device DS and the integrated structure SI to fill in the space between these two elements at the interconnection bumps and thus further improve the mechanical robustness of the assembly as well as the thermal insulation between the conductor interconnection bumps and the superconductor interconnection bumps.

By Bonding

In an alternative embodiment shown in FIG. 12 and in FIG. 13, the semiconductor device or devices DS are not fastened to the integrated structure SI using bumps, but via a bonding technique. More particularly, at the first surface SIS1 of the integrated structure SI, connection pads PES, PEC are carried out above the routing tracks PC, PS in a material of the same type as the routing track located below the pads (a connection pad PEC located above a conductor routing track PC will be carried out in a conductor material; likewise a connection pad PES located above a superconductor routing track PS will be made from a superconductor material). Thus, as shown in FIG. 12A, the integrated structure SI comprises, on its first surface SIS1, a first plurality of conductor connection pads PEC and a first plurality of superconductor connection pads PES. Likewise, the rear face FR of the semiconductor device DS comprises a second plurality of conductor connection pads CC configured in such a way as to be able to be placed facing the first plurality of conductor connection pads PEC and a second plurality of superconductor connection pads CS configured in such a way as to be able to be placed facing the first plurality of superconductor connection pads PES, said connection pads being formed in a layer of a dielectric material, for example a passivation layer.

In an embodiment, the assembly then comprises:
a step of selective etching of the connection pads PEC, PES, for example via CMP, in such a way as to form a recess with respect to the surface of the layer of a dielectric material DE wherein the connection pads PEC, PES are formed (FIG. 12B);
a step of depositing, for example a solid plate deposition via PVD, a layer of a superconductor material, the thickness of the layer deposited being comprised between 50 and 100 nm.

The steps of etching and of deposition described hereinabove are optional, but make it possible to facilitate the step of chemical mechanical polishing that follows, the same material being present on all the connection pads.

The method then comprises a step of chemical mechanical polishing to the surface of the layer of a dielectric material. Thus, as shown in FIG. 12C, a layer of a superconductor material PCS is thus formed on each connection pad PEC, PES. When the steps of etching and of deposition are not carried out, then the bonding which shall now be described is carried out at the conductor-conductor interface for the conductor pads and at the superconductor-superconductor interface for the superconductor pads.

As shown in FIG. 13, the method for assembly then comprises:
a step of putting the first surface SIS1 of the integrated structure SI in contact with the rear face FR of the semiconductor device DS, the connection pads PEC, PES of the integrated structure SI being put into correspondence with the connection pads CC, CS of the semiconductor device DS;
a step of annealing or thermocompression in such a way as to glue the connection pads together, desirably via the layer of a superconductor material PCS when such a layer was deposited beforehand.

In an embodiment, the pads thus formed are of square shape (according to a parallel plane defined by the first surface SIS1) and have a width comprised between 0.4 μm and 25 μm. In an embodiment, the surface of the layer of a superconductor material PCS at the end of the step of CMP, at the face intended to be glued on another layer of a superconductor material PCS, has a roughness RMS measured over the total surface of a pad less than 0.5 nm. The measurement of this roughness can for example be taken using an atomic force microscope (AFM).

In an embodiment, the thickness of the connection connecting a superconductor routing track of the semiconductor device DS with a superconductor routing track of the integrated structure SI is comprised between 600 nm and 1,200 nm, desirably equal to 1,000 nm (this comprises the thickness of the superconductor connection pads on the SI and on the DS as well as the two layers of a superconductor material deposited in order to ensure the bonding and melting during annealing). Moreover, the thickness of the conductor connection (in other words, the thickness of the structure framed in FIG. 13) will be identical to that of the superconductor connection (i.e. comprised between 600 nm and 1,200 nm, desirably equal to 1,000 nm), the thickness of the superconductor layer (obtained by melting of the superconductor layers during the bonding) being of a few nanometres (desirably less than 10 nm). Thus, the superconductor layer PCS has for main function to ensure the uniformity of the surfaces during the method CMP preceding the bonding.

The assembly thus obtained is shown at the bottom of FIG. 13. The assembly via direct bonding such as has just been described makes it possible to consider high-density integration patterns with pitches between interconnections less than 1 μm. This aspect is particularly beneficial for the large-scale integration of silicon spin qubits of which the devices are not large with a typical surface of 100 $nm^2$, compared to 100 $μm^2$ for superconductor qubits for example.

In the assembly shown in FIG. 13, i.e. when a step of selective etching of the connection pads PEC, PES and a step of depositing a layer of a superconductor material are implemented, the superconductor routing tracks of the integrated structure SI are connected to the superconductor routing tracks of the semiconductor device DS via a stack of superconductor layers. In addition, the conductor routing tracks of the integrated structure SI are connected to the conductor routing tracks of the semiconductor device DS by a structure comprised of a first layer in a conductor material, of a second layer of a superconductor conductor material (corresponding to a first portion of the bonding pad), a third layer of a superconductor material (corresponding to a second portion of the bonding pad) and a fourth layer of a conductor material (cf. structure framed in FIG. 13). However, in order to ensure good thermalisation of the semiconductor device DS, it is necessary that a heat exchange can take place between the first layer of a conductor material PEC and the fourth layer of a conductor material PEC, and this despite the presence of two layers of a superconductor material PCS that separates them. For this, it is possible to consider two operating modes.

A first operating mode is based on the proximity effect between the conductor material of the fourth layer of a conductor material PEC and of the first layer of a conductor material PEC, and the superconductor material PCS, this effect making it possible to weaken the superconductor properties of the latter. When this first operating mode is desired, the thickness of the superconductor material (i.e. the total thickness of the second layer and of the third superconductor layer) is desirably comprised between 1 and 20 nm. For the purposes of illustration, for a copper/niobium/copper tri-layer, it was reported experimentally that the critical temperature and therefore the superconductor properties of niobium start to weaken for a total thickness of niobium of about 50 nm. Likewise, a reduction in the critical temperature critique by a factor of two (2) is observed for a total thickness of niobium of 20 nm. The extrapolation of these results suggests a reduction in the superconductor properties exponentially by continuing to reduce the thickness of the superconductor material. These results stem from a study on a copper/niobium/copper tri-layer deposited on the same substrate. It is reasonable to suppose that the copper/niobium/niobium/copper quadri-couches formed during the bonding will have degraded superconductor properties in relation to the reference mentioned, in particular due to the method of manufacture that is more complex including in particular chemical mechanical polishing and an annealing.

A second operating mode is based on the superconductor/conductor transition when the current that passes through the superconductor material is passed through by a current density greater than a critical current density. In this operating mode, the thickness of the layer of a superconductor material can be greater than 20 nm: the transition of this metal to its normal mode will take place by applying a current greater than its critical current. For example, if the superconductor material is niobium, knowing that the critical current density is about 10 $kA/cm^2$, with a connection pad with a side of 1 μm, a current of about 0.1 mA will be sufficient to trigger the superconductor/conductor transition.

As has already been underlined, the integrated structure SI according to the invention can be particularly beneficial in the framework of quantum computing, and in particular for setting up a "heat cage" making it possible to insulate the qubits, for example spin qubits, from the heat generally coming from the operation of the semiconductor control devices in charge of controlling the qubits. In what follows, in order to facilitate understanding, a semiconductor device DS in charge of controlling a qubit or a network of qubits will be named control chip PCR and the semiconductor device DS comprising at least one qubit will be named functional chip PFL. More generally, a control chip PCR can correspond to any heat-generating semiconductor device DS and a functional chip PFL can correspond to any semiconductor device DS that has to be insulated from this generated heat.

The Functional Chip

A semiconductor functional chip PFL according to an aspect of the invention is shown in FIGS. 14A (side view of a functional chip according to the invention) and 14B (top view of a functional chip according to the invention). In these two figures, the functional chip PFL comprises a substrate P2, desirably made from silicon, comprising a first face and a second face S2, the second face of the substrate P2 forming the front face S2 of the functional chip, said substrate P2 making it possible to ensure the mechanical robustness of the functional chip PFL. It also comprises a first oxide layer OXC on the first face of the substrate P2, a second oxide layer BOX on the first oxide layer OXC as well as a first conductor routing level NM1 (i.e. a routing level comprising only conductor routing tracks) formed on the surface of the second oxide layer BOX in contact with the first oxide layer OXC, said conductor routing level NM1 desirably occupying between 10% and 50% of the surface of the second oxide layer BOX on which it is located. The functional chip PFL moreover comprises a third oxide layer OX on the second oxide layer BOX wherein at least one semiconductor component QB is inserted. In addition, the functional chip comprises a rear face S1 formed by the surface of the third oxide layer opposite the second oxide layer BOX and able to be glued to the first surface SIS1 of an integrated structure SI according to the invention, the rear face S1 comprising a second routing level comprising a plurality of superconductor routing tracks NS surrounded at least partially by one or more conductor routing tracks NM2. Moreover, the semiconductor component QB is connected to the superconductor routing tracks NS via superconductor vias VQS in such a way as to be able to electrically control the semiconductor component QB, without however exposing the latter thermally. In addition, at least one portion of the conductor routing tracks NM2 of the rear face S1 are connected to a portion at least of the routing tracks of the first conductor routing level NM1 of the front face S2 via conductor vias V12 in such a way as to form a heat cage around the semiconductor component, the other routing tracks contributing to the good thermalisation of the rear face S1 and of the front face S2 of the functional chip PFL. In an embodiment, the semiconductor component QB is a qubit QB, desirably a spin qubit QB formed by a transistor.

So, it results from this structure that a functional chip PFL according to the invention, although it can be connected on other structures than that of the invention, is perfectly suited to the integrated structure SI according to the invention in that it makes it possible to take advantage of the bifunctional routing. In addition to the benefits already mentioned hereinabove, in the functional chip PFL that has just been described, the conductor level NM1 can be used as a backgate.

In an embodiment, the thickness of the second oxide layer BOX is comprised between 10 nm and 1 μm, desirably comprised between 10 nm and 50 nm. In an embodiment, the conductor routing tracks NM2 located on the rear face S1 are disposed in such a way as to not face the routing tracks of the first conductor routing level NM1 located on the surface of the second oxide layer BOX in contact with the first oxide layer OXC. This configuration makes it possible to limit the parasitic capacitances. In an alternative embodiment, the percentage of the surface of conductor tracks of the first routing level NM1 facing a conductive track NM2 of the second routing level is less than or equal to 10% of the total surface of the first routing level NM1, desirably less than or equal to 1% of the total surface of the first routing level NM1.

In an embodiment, the routing tracks NM1 of the front face S2 and the routing tracks NM2 of the rear face S1 are disposed in such a way as to limit the intersections between the routing tracks NM1 of the front face S2 and the routing tracks NM2 of the rear face S1 so as to not form metallic loops between the routing levels NM1 and NM2 which could trap a magnetic flux.

In an embodiment, an exclusion zone of a few μm around the semiconductor component QB can be defined by conditioning the position of the conductor routing tracks NM2 on the first surface S1 and the conductor routing tracks of the first conductor routing level NM1. For this, in an embodiment, the distance between the conductor tracks NM1, NM2 (i.e. the conductor tracks of the first conductor routing level NM1 and the conductor tracks NM2 of the second routing level) and the semiconductor component QB is greater than or equal to 100 μm in order to prevent heating of the semiconductor component QB by the conductor routing tracks NM1 and NM2.

In an embodiment, the minimum distance between each routing track NM1, NM2 (i.e. the conductor tracks of the first conductor routing level NM1 and the conductor tracks NM2 of the second routing level) is comprised between 1 μm and 10 μm, for example equal to 5 μm, regardless of the routing level considered. Thus, this minimum distance relates to two routing tracks located on the same routing level or two routing tracks located on two different routing levels. In this latter case, the distance is measured at the first routing track on the first surface and the projection of the second routing track on the first surface.

In an embodiment, the routing tracks of the first routing level NM1 have a width comprised between 50 nm and 500 μm, desirably a width equal to 5 μm.

In an embodiment, the conductor routing tracks NM2 of the second routing level (at the rear face S1) have a width comprised between 50 nm and 10 μm, desirably a width equal to 1 μm.

In an embodiment, the conductor vias V12 connecting the conductor routing tracks NM1 of the front face S2 to the conductor routing tracks NM2 of the rear face S1 have a square section. In an embodiment, the width of the square section is comprised between 200 nm and 400 nm. In an embodiment at least one portion of the vias takes the form of a matrix of vias, the vias of said matrix all connecting the same routing tracks. In an embodiment, the matrix of vias is of the form 2×2, i.e. four vias arranged in such a way as to form two columns each comprising two vias. In an embodiment, the matrix of vias is of the form 4×4, i.e. eight vias arranged in such a way as to form four columns each comprising four vias. Other forms can of course be considered.

In an embodiment, each superconductor track comprises one or more connection pads (similar to the connection zones described in the case of the integrated structure SI) and the different terminals of the semiconductor component QB are each connected to a superconductor connection pad of one of the superconductor routing tracks NS via a superconductor via VQS and the minimum distance Ids between the connection pads connected to the semiconductor component and said semiconductor component is greater than or equal to 5 µm, desirably greater than or equal to 10 µm. Such a distance makes it possible to limit the formation of parasitic capacitances between the connection pads and the semiconductor component.

In an embodiment, the connection pads of superconductor routing tracks have a square section with a width comprised between 500 nm and 5 µm and the superconductor routing tracks NS have a width comprised between 50 nm and 100 µm. These dimensions are particularly beneficial when the chip PFL is intended to be connected to an integrated structure SI by bonding.

In an embodiment, each conductor routing track NM2 of the rear face S1 comprises one or more connection pads (similar to the connection zones described in the case of the integrated structure SI) and these connection pads have a square section with a width comprised between 500 nm and 5 µm. These dimensions are particularly beneficial when the chip PFL is intended to be connected to an integrated structure SI by bonding.

Manufacture of the Functional Chip

FIGS. 15A to 15H describe different steps of a method for manufacturing a functional chip PFL such as has just been described. This method takes as a starting point a structure comprising a substrate SIL, for example a silicon substrate, a layer of oxide OX referred to as third oxide layer, a semiconductor component (a quantum bit surrounded by a dotted line in FIGS. 15A to 15H) formed in the third oxide layer OX and a second oxide layer BOX on which the third oxide layer OX rests. From this structure, the method comprises:

- a step of forming routing tracks NM2, NS on a first face S1, referred to as rear face, using a method identical to the one already used to form the conductor PC and superconductor PS routing tracks on the first face SIS1 of the integrated structure SI (FIG. 15A), the superconductor routing tracks NS being in electrical contact with the semiconductor component via superconductor vias;
- a step of depositing a layer of oxide OXC on the rear face S1 so as to obtain good planarity before bonding (FIG. 15B);
- a step of bonding the rear face on a silicon handle P1 and turning over of the unit (FIG. 15C);
- a step of thinning the substrate SIL including:
  - a step of grinding, said step of grinding being stopped when the grinder is at a distance of about a µm from the second oxide layer BOX;
  - a substep of wet etching in such a way as to remove the remaining silicon and thus clear the second oxide layer BOX at a second face opposite the first face (FIG. 15D);
- a step of creating conductor vias V12 connecting the conductor routing tracks NM2 located on the rear face using a method identical to the one used to carry out the inter-level conductor vias VIC of the integrated structure SI;
- a step of carrying out conductor tracks NM1 at the second face in such a way as to form a first conductor routing level, for example using a method identical to the one used for carrying out conductor routing tracks on the first surface SIS1 of the integrated structure SI or the carrying out of conductor routing tracks on the second surface SIS2 of the integrated structure SIS2 (FIG. 15E);
- a step of depositing on the second face a layer of oxide OXC, referred to as first oxide layer OXC, so as to obtain good planarity before collage (FIG. 15F);
- a step of bonding the second face on a silicon handle P2 (FIG. 15G);
- a step of removing the first handle P1 (FIG. 15H).

At the end of this method, a functional chip such as shown in FIG. 14 is obtained.

Assembly of the Functional Chip with the Integrated Structure

As has already been mentioned, in an embodiment, it is possible to connect the chips to the integrated structure SI by means of conductor bumps CBI and superconductor bumps SBI. This first assemblage AS is shown in FIG. 16. In this figure, the integrated structure SI and the control chip PCR are simplified, the control chip PCR allowing to appear only the control circuit CR, while the functional chip PFL has been deformed in order to leave apparent the type of material used (superconductor or conductor).

Also as mentioned, in a second embodiment, it is possible to connect the chips to the integrated structure SI by bonding. This assembly AS is shown in FIG. 17. In this figure also, the integrated structure SI and the control chip PCR are simplified while the functional chip PFL was deformed in such a way as to leave apparent the type of material used (superconductor or conductor).

In a third embodiment, certain chips can be connected to the integrated structure SI by means of conductor and superconductor bumps while others can be connected by bonding. This assembly AS is shown in FIG. 18 wherein the control chip PCR is connected by conductor and superconductor bumps while the functional chip PFL is connected by bonding. In this figure encore, the integrated structure SI and the control chips are simplified while the functional chip has been deformed in such a way as to leave apparent the type of materials used (superconductor or conductor). The choice of the hybridization (bumps or bonding) can in particular depend on the connection densities and therefore on the integrated densities of each chip.

In these three embodiments, the control chip PCR controls the functional chip PFL by means of one or more superconductor routing tracks, which makes it possible to thermally decouple the functional chip PFL from the control chip PCR. Furthermore, as described hereinabove, the semiconductor component (here a qubit) present on the functional chip PFL is surrounded by a thermalised heat cage by means of conductor routing tracks of the integrated structure SI, in such a way that it is thermally insulated from its close environment and in particular from the control chip PCR. Note that, in the examples of FIGS. 16 to 18, a heat cage is also present around the control circuit CR of the control chip PCR so as to further improve the thermal insulation between functional chip PFL and control chip PCR. Although desirable, this heat cage is however optional for the control chip PCR.

In an embodiment, the integrated structure SI is also configured to ensure the role of control chip PCR. An assembly AS corresponding to this configuration is shown in FIG. 19 in the particularly beneficial embodiment where the functional chip is connected by bonding to the integrated structure SI configured to operate as a control chip PCR. In this embodiment, conductor vias at the periphery of the integrated structure SI and therefore separated from the control circuit CR, make it possible to thermalise the functional chip PFL in such a way as to be able to form a heat cage around the latter (greyed zone in the figure). In the embodiment shown in FIG. 19, a heat half-cage (this here is a half-cage in that the cage does not surround the lower portion of the control circuit CR) is furthermore formed around the control circuit CR in order to improve the thermal insulation between the latter and the functional chip PFL.

In an embodiment, a thermally insulating epoxy filled resin can be injected between the integrated structure SI and the semiconductor devices DS connected by means of conductor and superconductor bumps. This epoxy will make it possible to improve the mechanical resistance of the assembly AS during repeated thermal cycles and to thermally insulate the electrical and thermal interconnections. In the case where the semiconductor devices contain qubits, the choice of this epoxy will have to be made in order to prevent the creation of additional loss mechanisms that can impact the qubits.

System Comprising an Assembly According to the Invention Connected to a Printed Circuit A sixth aspect of the invention shown in FIG. 20 relates to a system SY comprising a printed circuit CI and an assembly AS according to the invention. In the example of FIG. 20, the assembly AS is connected to the printed circuit CI via the integrated structure SI by means of conductor bumps. However, as shown in FIG. 10, other connection means can be considered. The assembly AS comprises at least one first semiconductor device DS in the form of a functional chip PFL and a second semiconductor device DS in the form of a control chip PCR. Furthermore, the control chip PCR is connected to the functional chip PFL via the integrated structure SI by means of superconductor routing tracks PS. Thus, the control chip PCR can electrically control the functional chip PFL without however communicating to the latter energy in the form of heat, the connection being made by means of one or more superconductor routing tracks. Furthermore, the functional chip PFL and the control chip PCR are connected to the integrated structure by means of one or more conductor routing tracks so as to guarantee good thermalisation of the chips PCR, PFL.

In an embodiment, the functional chip PFL is a functional chip PFL according to a fourth aspect of the invention. In this embodiment, the conductor tracks NM1, NM2 and conductor through vias V12 of the functional chip PFL form a "heat cage" around the qubit QB, this heat cage being initiated by the conductor routing tracks and conductor through vias of the integrated structure SI.

The system SY according to a sixth aspect of the invention makes it possible to obtain the cooling diagram shown in FIG. 21. In this figure, the printed circuit CI is thermalised at a temperature of a few mK by the mixing box of the cryostat. The printed circuit CI thermalise in turn the integrated structure SI which, thanks to the bi-functional routing, makes it possible to obtain a heat cage around different semiconductor devices PFL, PCR connected to the integrated structure SI.

The invention claimed is:

1. A functional chip comprising:
   a substrate comprising a first face and a second face, the second face of the substrate forming a front face of the functional chip;
   a first oxide layer on the first face of the substrate;
   a second oxide layer on the first oxide layer;
   a first routing level formed on the surface of the second oxide layer in contact with the first oxide layer;
   a third oxide layer on the second oxide layer, wherein at least one semiconductor component is inserted;
   a rear face formed by the surface of the third oxide layer opposite the second oxide layer, the rear face comprising a plurality of superconductor routing tracks surrounded at least partially by one or more conductor routing tracks, the semiconductor component being connected to the superconductor routing tracks via superconductor vias and the conductor routing tracks of the rear face being connected to the first routing level via conductor vias.

2. The functional chip according to claim 1, wherein the semiconductor component is a qubit.

3. The functional chip according to claim 2, wherein the qubit is a silicon spin qubit.

4. The functional chip according to claim 3, wherein routing tracks of the front face and the routing tracks of the rear face are disposed so that the projections of the routing tracks of the front face on the rear face do not intersect the routing track of the rear face.

5. The functional chip according to claim 1, wherein the routing tracks of the front face have a width comprised between 50 nm and 500 µm.

6. The functional chip according to claim 1, wherein the routing tracks of the rear face have a width comprised between 50 nm and 10 µm.

7. The functional chip according to claim 1, wherein a minimum distance between each routing track is comprised between 1 µm and 10 µm, regardless of the routing level considered.

8. The functional chip according to claim 1, wherein the distance between the conductor tracks and the semiconductor component is greater than or equal to 100 µm.

9. The functional chip according to claim 1, wherein a percentage of the surface of conductor tracks of the first routing level facing a conductive track of the second routing level is less than or equal to 10% of the total surface of the first routing level.

10. The functional chip according to claim 1, wherein the plurality of superconductor routing tracks are made of a superconductor material comprising niobium (Nb), niobium nitride (NbN), titanium nitride (TiN), tantalum nitride (TaN), tantalum (Ta), vanadium (V), niobium alumina ($Nb_3Al$), alloys of tin-niobium, titanium-niobium or a mixture of vanadium and silicon and the one or more conductor routing tracks are made of a conductor material comprising copper or tungsten.

11. A method for manufacturing a functional chip from a starting structure comprising a substrate, a layer of oxide referred to as third oxide layer, a semiconductor component formed in the third oxide layer and a second oxide layer on which the third oxide layer rests, the method comprising:
   forming routing tracks on a first face, referred to as rear face, the superconductor routing tracks being in electrical contact with the semiconductor component via superconductor vias already present in the starting structure;
   depositing a layer of oxide on the rear face so as to obtain good planarity;

bonding the rear face on a silicon handle followed by a turning over of the unit thus formed;

thinning the substrate;

creating conductor vias connecting the conductor routing tracks located on the rear face;

creating conductor tracks at the second face so as to form a first conductor routing level;

depositing a layer of oxide on the second face, referred to as first oxide layer, so as to obtain good planarity;

step of bonding the second face on a silicon handle; and removing the first handle.

12. The method according to claim 11, wherein the thinning of the substrate comprises:

a step of grinding, said step of grinding being stopped when the grinder is at a distance of about a μm from the second oxide layer;

a sub step of wet etching so as to remove the remaining portion of substrate and thus clear the second oxide layer at a second face opposite the first face.

* * * * *